United States Patent
Murthy et al.

(10) Patent No.: US 11,387,320 B2
(45) Date of Patent: *Jul. 12, 2022

(54) TRANSISTORS WITH HIGH CONCENTRATION OF GERMANIUM

(71) Applicant: INTEL CORPORATION, Santa Clara, CA (US)

(72) Inventors: Anand S. Murthy, Portland, OR (US); Glenn A. Glass, Portland, OR (US); Tahir Ghani, Portland, OR (US); Ravi Pillarisetty, Portland, OR (US); Niloy Mukherjee, Portland, OR (US); Jack T. Kavalieros, Portland, OR (US); Roza Kotlyar, Portland, OR (US); Willy Rachmady, Beaverton, OR (US); Mark Y. Liu, West Linn, OR (US)

(73) Assignee: Intel Corporation, Santa Clara, CA (US)

( * ) Notice: Subject to any disclaimer, the term of this patent is extended or adjusted under 35 U.S.C. 154(b) by 281 days.

This patent is subject to a terminal disclaimer.

(21) Appl. No.: 16/707,490

(22) Filed: Dec. 9, 2019

(65) Prior Publication Data

US 2020/0144362 A1    May 7, 2020

Related U.S. Application Data

(63) Continuation of application No. 15/489,569, filed on Apr. 17, 2017, now abandoned, which is a
(Continued)

(51) Int. Cl.
  *H01L 29/06* (2006.01)
  *H01L 21/285* (2006.01)
  (Continued)

(52) U.S. Cl.
  CPC .... *H01L 29/0676* (2013.01); *H01L 21/02532* (2013.01); *H01L 21/28512* (2013.01);
  (Continued)

(58) Field of Classification Search
  CPC ..... H01L 2029/7858; H01L 21/823821; H01L 21/845; H01L 27/0886; H01L 27/0924;
  (Continued)

(56) References Cited

U.S. PATENT DOCUMENTS

| 5,089,872 A | 2/1992 | Ozturk et al. |
| 5,216,271 A | 6/1993 | Takagi et al. |

(Continued)

FOREIGN PATENT DOCUMENTS

| CN | 1518771 A | 8/2004 |
| CN | 101087002 A | 12/2007 |

(Continued)

OTHER PUBLICATIONS

Office Action from Japanese Patent Application No. 2019-189786, dated Nov. 4, 2020, 12 pgs.
(Continued)

*Primary Examiner* — Suberr L Chi
(74) *Attorney, Agent, or Firm* — Kinney & Lange, P. A.

(57) ABSTRACT

Techniques are disclosed for forming transistor devices having source and drain regions with high concentrations of boron doped germanium. In some embodiments, an in situ boron doped germanium, or alternatively, boron doped silicon germanium capped with a heavily boron doped germanium layer, are provided using selective epitaxial deposition in the source and drain regions and their corresponding tip regions. In some such cases, germanium concentration can be, for example, in excess of 50 atomic % and up to 100 atomic %, and the boron concentration can be, for instance, in excess of 1E20 cm$^{-3}$. A buffer providing graded germa-
(Continued)

nium and/or boron concentrations can be used to better interface disparate layers. The concentration of boron doped in the germanium at the epi-metal interface effectively lowers parasitic resistance without degrading tip abruptness. The techniques can be embodied, for instance, in planar or non-planar transistor devices.

20 Claims, 10 Drawing Sheets

Related U.S. Application Data continuation of application No. 14/535,387, filed on Nov. 7, 2014, now Pat. No. 9,637,384, which is a continuation of application No. 12/975,278, filed on Dec. 21, 2010, now Pat. No. 8,901,537.

(51) Int. Cl.

| | |
|---|---|
| H01L 29/165 | (2006.01) |
| H01L 29/45 | (2006.01) |
| H01L 29/49 | (2006.01) |
| H01L 29/66 | (2006.01) |
| H01L 29/78 | (2006.01) |
| H01L 29/423 | (2006.01) |
| H01L 21/768 | (2006.01) |
| H01L 29/167 | (2006.01) |
| H01L 21/02 | (2006.01) |
| H01L 29/08 | (2006.01) |
| H01L 29/36 | (2006.01) |
| H01L 27/092 | (2006.01) |
| H01L 23/535 | (2006.01) |
| H01L 29/417 | (2006.01) |
| H01L 21/3215 | (2006.01) |
| H01L 29/778 | (2006.01) |

(52) U.S. Cl.
CPC .. *H01L 21/28518* (2013.01); *H01L 21/28525* (2013.01); *H01L 21/3215* (2013.01); *H01L 21/76805* (2013.01); *H01L 21/76831* (2013.01); *H01L 21/76843* (2013.01); *H01L 21/76864* (2013.01); *H01L 21/76895* (2013.01); *H01L 23/535* (2013.01); *H01L 27/092* (2013.01); *H01L 27/0924* (2013.01); *H01L 29/0615* (2013.01); *H01L 29/086* (2013.01); *H01L 29/0847* (2013.01); *H01L 29/165* (2013.01); *H01L 29/167* (2013.01); *H01L 29/36* (2013.01); *H01L 29/41791* (2013.01); *H01L 29/42392* (2013.01); *H01L 29/45* (2013.01); *H01L 29/456* (2013.01); *H01L 29/4966* (2013.01); *H01L 29/6659* (2013.01); *H01L 29/66477* (2013.01); *H01L 29/66545* (2013.01); *H01L 29/66628* (2013.01); *H01L 29/66636* (2013.01); *H01L 29/66681* (2013.01); *H01L 29/66795* (2013.01); *H01L 29/66931* (2013.01); *H01L 29/7785* (2013.01); *H01L 29/78* (2013.01); *H01L 29/785* (2013.01); *H01L 29/7816* (2013.01); *H01L 29/7833* (2013.01); *H01L 29/7848* (2013.01); *H01L 29/7851* (2013.01)

(58) Field of Classification Search
CPC ........... H01L 29/66795; H01L 29/7831; H01L 29/785–7856
See application file for complete search history.

(56) References Cited

U.S. PATENT DOCUMENTS

| | | |
|---|---|---|
| 5,281,552 A | 1/1994 | King et al. |
| 5,296,386 A | 3/1994 | Aronowitz et al. |
| 5,296,387 A | 3/1994 | Aronowitz et al. |
| 5,312,766 A | 5/1994 | Aronowitz et al. |
| 5,644,166 A | 7/1997 | Honeycutt et al. |
| 6,235,568 B1 | 5/2001 | Murthy et al. |
| 6,274,894 B1 | 8/2001 | Wieczorek et al. |
| 6,541,343 B1 | 4/2003 | Murthy et al. |
| 6,605,498 B1 | 8/2003 | Murthy et al. |
| 6,607,948 B1 | 8/2003 | Sugiyama et al. |
| 6,621,131 B2 | 9/2003 | Murthy et al. |
| 6,653,700 B2 | 11/2003 | Chau et al. |
| 6,797,556 B2 | 9/2004 | Murthy et al. |
| 6,812,086 B2 | 11/2004 | Murthy et al. |
| 6,861,318 B2 | 3/2005 | Murthy et al. |
| 6,885,084 B2 | 4/2005 | Murthy et al. |
| 6,887,762 B1 | 5/2005 | Murthy et al. |
| 6,933,589 B2 | 8/2005 | Murthy et al. |
| 6,949,482 B2 | 9/2005 | Murthy et al. |
| 6,952,040 B2 | 10/2005 | Chau et al. |
| 6,972,228 B2 | 12/2005 | Doyle et al. |
| 7,060,576 B2 | 6/2006 | Lindert et al. |
| 7,129,139 B2 | 10/2006 | Murthy et al. |
| 7,135,724 B2 | 11/2006 | Chen et al. |
| 7,138,320 B2 | 11/2006 | Van Bentum et al. |
| 7,138,697 B2 | 11/2006 | Chu et al. |
| 7,221,006 B2 | 5/2007 | Orlowski et al. |
| 7,226,842 B2 | 6/2007 | Murthy et al. |
| 7,244,668 B2 | 7/2007 | Kim |
| 7,274,055 B2 | 9/2007 | Murthy et al. |
| 7,338,873 B2 | 3/2008 | Murthy et al. |
| 7,358,547 B2 | 4/2008 | Murthy et al. |
| 7,391,087 B2 | 6/2008 | Murthy et al. |
| 7,402,872 B2 | 7/2008 | Murthy et al. |
| 7,427,775 B2 | 9/2008 | Murthy et al. |
| 7,436,035 B2 | 10/2008 | Murthy et al. |
| 7,491,643 B2 | 2/2009 | Lavoie et al. |
| 7,492,017 B2 | 2/2009 | Murthy et al. |
| 7,494,858 B2 | 2/2009 | Bohr et al. |
| 7,518,196 B2 | 4/2009 | Chau et al. |
| 7,544,997 B2 | 6/2009 | Zhang et al. |
| 7,662,689 B2 | 2/2010 | Boyanov et al. |
| 7,663,192 B2 | 2/2010 | Sell et al. |
| 7,667,227 B2 | 2/2010 | Shimamune et al. |
| 7,678,631 B2 | 3/2010 | Murthy et al. |
| 7,682,887 B2 | 3/2010 | Dokumaci et al. |
| 7,682,916 B2 | 3/2010 | Murthy et al. |
| 7,683,362 B2 | 3/2010 | Ohta et al. |
| 7,732,285 B2 | 6/2010 | Sell et al. |
| 7,807,538 B2 | 10/2010 | Yamauchi |
| 7,821,044 B2 | 10/2010 | Bohr et al. |
| 7,880,228 B2 | 2/2011 | Yasutake |
| 8,039,902 B2 | 10/2011 | Kim et al. |
| 8,354,694 B2 | 1/2013 | Bedell et al. |
| 8,575,652 B2 | 11/2013 | Kamata |
| 8,598,003 B2 | 12/2013 | Murthy et al. |
| 8,901,537 B2 | 12/2014 | Murthy et al. |
| 8,994,104 B2 | 3/2015 | Glass et al. |
| 9,117,791 B2 | 8/2015 | Glass et al. |
| 9,349,810 B2 | 5/2016 | Glass et al. |
| 9,437,691 B2 | 9/2016 | Glass et al. |
| 9,484,432 B2 | 11/2016 | Glass et al. |
| 9,627,384 B2 | 4/2017 | Murthy et al. |
| 9,722,023 B2 | 8/2017 | Glass et al. |
| 10,700,178 B2 * | 6/2020 | Glass ............... H01L 21/76864 |
| 2002/0168868 A1 | 11/2002 | Todd |
| 2002/0197806 A1 | 12/2002 | Furukawa et al. |
| 2003/0057416 A1 | 3/2003 | Currie et al. |
| 2003/0124761 A1 | 7/2003 | Baert et al. |
| 2003/0157787 A1 | 8/2003 | Murthy |
| 2004/0014276 A1 | 1/2004 | Murthy |
| 2005/0130454 A1 | 6/2005 | Murthy et al. |
| 2005/0145944 A1 | 7/2005 | Murthy et al. |
| 2005/0184354 A1 | 8/2005 | Chu et al. |
| 2006/0060859 A1 | 3/2006 | Joshi et al. |

(56) References Cited

U.S. PATENT DOCUMENTS

| | | |
|---|---|---|
| 2006/0065914 A1 | 3/2006 | Chen et al. |
| 2006/0125025 A1 | 6/2006 | Kawashima et al. |
| 2006/0138398 A1 | 6/2006 | Shimamune et al. |
| 2006/0148151 A1 | 7/2006 | Murthy et al. |
| 2006/0156080 A1 | 7/2006 | Tellkamp et al. |
| 2006/0172511 A1 | 8/2006 | Kammler et al. |
| 2006/0199622 A1 | 9/2006 | Bhanji et al. |
| 2006/0237746 A1 | 10/2006 | Orlowski et al. |
| 2006/0255330 A1 | 11/2006 | Chen et al. |
| 2006/0289856 A1 | 12/2006 | Shimamune et al. |
| 2007/0004123 A1 | 1/2007 | Bohr et al. |
| 2007/0053381 A1 | 3/2007 | Chacko et al. |
| 2007/0075378 A1 | 4/2007 | Lin et al. |
| 2007/0122954 A1 | 5/2007 | Liu |
| 2007/0145487 A1 | 6/2007 | Kavalieros et al. |
| 2007/0187767 A1 | 8/2007 | Yasutake |
| 2007/0235802 A1 | 10/2007 | Chong et al. |
| 2007/0238236 A1 | 10/2007 | Cook et al. |
| 2007/0254414 A1 | 11/2007 | Miyanami |
| 2007/0264801 A1 | 11/2007 | Cody et al. |
| 2007/0275548 A1 | 11/2007 | Lavoie et al. |
| 2007/0294757 A1 | 12/2007 | Stephens et al. |
| 2008/0054347 A1 | 3/2008 | Wang |
| 2008/0135878 A1 | 6/2008 | Kim et al. |
| 2008/0135949 A1 | 6/2008 | Lo et al. |
| 2008/0179752 A1 | 7/2008 | Yamauchi et al. |
| 2008/0197412 A1 | 8/2008 | Zhang et al. |
| 2008/0230805 A1 | 9/2008 | Hokazono et al. |
| 2008/0242037 A1 | 10/2008 | Sell et al. |
| 2009/0075029 A1 | 3/2009 | Thomas et al. |
| 2009/0206370 A1 | 8/2009 | Chu et al. |
| 2009/0224369 A1 | 9/2009 | Gamble et al. |
| 2009/0242989 A1 | 10/2009 | Chan et al. |
| 2009/0302348 A1 | 12/2009 | Adam et al. |
| 2010/0109044 A1 | 5/2010 | Tekleab et al. |
| 2010/0123198 A1 | 5/2010 | Kim et al. |
| 2010/0148217 A1 | 6/2010 | Simonelli et al. |
| 2010/0197092 A1 | 8/2010 | Kim et al. |
| 2010/0244154 A1 | 9/2010 | Yasutake |
| 2010/0272859 A1 | 10/2010 | Given |
| 2010/0295021 A1 | 11/2010 | Chang et al. |
| 2011/0062498 A1 | 3/2011 | Yang et al. |
| 2011/0068407 A1 | 3/2011 | Yeh et al. |
| 2011/0147811 A1 | 6/2011 | Kavalieros et al. |
| 2011/0147828 A1* | 6/2011 | Murthy ............. H01L 21/02636 257/327 |
| 2011/0183486 A1 | 7/2011 | Chan et al. |
| 2012/0007051 A1 | 1/2012 | Bangsaruntip et al. |
| 2012/0037998 A1 | 2/2012 | Bedell |
| 2012/0153387 A1 | 6/2012 | Murthy et al. |
| 2012/0161249 A1 | 6/2012 | Kronholz et al. |
| 2013/0240989 A1 | 9/2013 | Glass et al. |
| 2013/0248999 A1 | 9/2013 | Glass |
| 2013/0264639 A1 | 10/2013 | Glass et al. |
| 2014/0070377 A1 | 3/2014 | Yu et al. |
| 2014/0231914 A1 | 8/2014 | Chang et al. |
| 2015/0060945 A1 | 3/2015 | Murthy et al. |
| 2015/0206942 A1 | 7/2015 | Glass et al. |
| 2015/0333180 A1 | 11/2015 | Glass et al. |
| 2016/0322359 A1 | 11/2016 | Glass et al. |
| 2016/0372547 A1 | 12/2016 | Glass et al. |
| 2017/0047419 A1 | 2/2017 | Glass et al. |
| 2017/0221724 A1 | 8/2017 | Murthy et al. |
| 2017/0373147 A1 | 12/2017 | Glass et al. |

FOREIGN PATENT DOCUMENTS

| | | |
|---|---|---|
| CN | 101140948 A | 3/2008 |
| CN | 101300664 A | 11/2008 |
| CN | 101622690 | 1/2010 |
| CN | 101677110 A | 3/2010 |
| CN | 102171794 | 8/2011 |
| JP | S6313379 A | 1/1988 |
| JP | H10261792 A | 9/1998 |
| JP | 2005183160 A | 7/2005 |
| JP | 2006013428 | 1/2006 |
| JP | 2006186240 A | 7/2006 |
| JP | 2007036205 A | 2/2007 |
| JP | 2007165665 A | 6/2007 |
| JP | 2007169958 A | 7/2007 |
| JP | 2007214481 A | 8/2007 |
| JP | 2007-258485 | 10/2007 |
| JP | 2007294757 A | 11/2007 |
| JP | 2007294780 A | 11/2007 |
| JP | 2007318132 A | 12/2007 |
| JP | 2008034650 | 2/2008 |
| JP | 2008192989 | 8/2008 |
| JP | 2008533695 A | 8/2008 |
| JP | 2008218725 A | 9/2008 |
| JP | 2009-517867 | 4/2009 |
| JP | 2009514248 A | 4/2009 |
| JP | 2009164281 A | 7/2009 |
| JP | 2009-182360 | 8/2009 |
| JP | 2009200090 A | 9/2009 |
| JP | 2010510720 A | 4/2010 |
| JP | 2010519734 A | 6/2010 |
| JP | 2010171337 A | 8/2010 |
| JP | 2010272859 A | 12/2010 |
| JP | 2012510720 A | 5/2012 |
| KR | 20080075009 A | 8/2008 |
| KR | 20090118935 A | 11/2009 |
| TW | 200304703 A | 10/2003 |
| TW | I690084 B | 4/2020 |
| WO | 2008100687 A1 | 8/2008 |
| WO | 2010014246 A1 | 2/2010 |
| WO | 2010068530 A2 | 6/2010 |
| WO | 2011084262 A2 | 7/2011 |
| WO | 2012087403 A1 | 6/2012 |
| WO | 2012087404 A1 | 6/2012 |
| WO | 2012087581 A2 | 6/2012 |
| WO | 2012088097 A2 | 6/2012 |

OTHER PUBLICATIONS

Korean Notice of Final Rejection received for Korean Patent Application No. 10-2013-7016008, dated Dec. 22, 2014, 6 pages.*.

Office Action received for Taiwan Patent Application No. 101148097, dated Oct. 13, 2014, 27 pages of Office Action including 13 pages of English Translation*.

Lin Ting Yu, "Silicon Nanowire Field Effect Transistor," date of thesis Aug. 5, 2009. English abstract with original retrieved online at URL: http://translate.google.com/translate?hl=en&sl=zh-TW&u=http://ir.lib.ntnu.edu.tw/handle/309250000Q/75302&prev=search. Nov. 19, 2014, 23 pages.*.

U.S. Appl. No. 14/535,387, filed Nov. 7, 2014, 64 pages.*.

"Metal/Semiconductor Ohmic Contacts Technology or Gate length Series Resistance (ohms)," URL: http://web.standford.edu/class/ee311/NOTES/Ohmic_Contacts.pdf. Retrieved Jul. 8, 2014 (1997) 25 pages.*.

European Patent Office Search Report received for EP Application No. 11852027.9. dated Aug. 14, 2014. 14 pages.*.

JP Notification of Reason(s) for Refusal, Japanese Patent Application No. 2013-546134, dated Aug. 26, 2014. 4 pages of English Translation and 3 pages of Office Action.*.

Notice of Reasons for Rejection issued by JP Patent Office for JP Application No. 2013-546135. dated Aug. 26, 2014. 7 pages (including Organized Translation of Notice of Reasons for Rejection).*.

Taiwan Office Action issued for TW Application No. 100145538. dated Sep. 12, 2014. 23 pages (including Translation of Notice).*.

Notice of Reasons for Rejection issued by JP Patent Office for JP Application No. 2013-546324. dated Aug. 22, 2014. 8 pages (including Organized Translation of Notice of Reasons for Rejection).*.

Office Action received for Korean Patent Application No. 10-2013-7016008, dated May 23, 2014, 4 pages of English Translation and 5 pages of Office Action.*.

Office Action received for Korean Patent Application No. 10-2013-7016371, dated May 23, 2014, 5 pages of English Translation and 6 pages of Office Action.*.

(56) References Cited

OTHER PUBLICATIONS

Office Action received for Korean Patent Application No. 2013-7015944, dated May 23, 2014, 4 pages of English Translation.*.
Office Action received for Korean Patent Application No. 2013-7016072, dated May 23, 2014, 4 pages English Translation.*.
Notice of Reasons for Rejection issued by JP Patent Office for JP Application No. 2013-543323. dated Aug. 5, 2014. 7 pages (including Organized Translation of Notice of Reason for Rejection).*.
International Search Report and Written Opinion received for PCT Application No. PCT/US2010/058199, dated Jul. 13, 2011, 10 pages.*.
International Preliminary Report on Patentability received for PCT Application No. PCT/US2010/058199, dated Jul. 5, 2012, 2 pages.*.
International Search Report and Written Opinion received for PCT Application No. PCT/US2011/054198, dated Apr. 19, 2012, 13 pages.*.
International Search Report and Written Opinion received for PCT Application No. PCT/US2011/063813, dated Jul. 23, 2012, 10 pages.*.
Zhu et al., "Germanium pMOSFETs With Schottky-Barrier Germanide S/D, High-K Gate Dielectric and Metal Gate", IEEE electron Device Letters, vol. 26, Issue No. 2, Feb. 2005, pp. 81-83.*.
International Search Report and Written Opinion received for PCT Application No. PCT/US2011/066129, dated Aug. 24, 2012, 11 pages.*.
International Preliminary Report on Patentability received for PCT Application No. PCT/US2011/063813, dated Jul. 4, 2013, 7 pages.*.
International Preliminary Report on Patentability and Written Opinion received for PCT Application No. PCT/US2011/054198, dated Jun. 25, 2013, 9 pages.*.
International Preliminary Report on Patentability and Written Opinion received for PCT Application No. PCT/US2011/054202, dated Jun. 25, 2013, 9 pages.*.
Datta et al., "Advanced Si and SiGe Strained Channel NMOS and PMOS Transistors with High-K/Metal-GareStack", IEEEXplore, Downloaded: Nov. 14, 2009, pp. 194-197.*.
Taiwan Decision of Rejection dated Dec. 26, 2014 for Taiwan Patent Application No. 100145538. 22 pages.*.
Korean Intellectual Property Office Notice of Final Rejection for KR Application No. 10-2013-7016371. dated Nov. 14, 2014; 6 pages with 3 pages of English Translation.*.
International Preliminary Report on Patentability and Written Opinion received for PCT Application No. PCT/US2011/066129, dated Jun. 25, 2013, 9 pages.*.
U.S. Appl. No. 13/990,249, filed May 29, 2013, 35 pages.*.
European Patent Office Search Report received for EP Application No. 11850136.0. dated Aug. 14, 2014, 14 pages.*.
International Search Report and Written Opinion received for PCT Application No. PCT/US2011/054202, dated Apr. 19, 2012, 13 pages.*.
Taiwan Decision of Final Rejection received for Taiwan Patent Application No. 101148097. dated Feb. 12, 2015, 28 pages.*.
Korean Notice of Final Rejection received for Korean Patent Application No. 2013-7015944. dated Dec. 22, 2014, 7 pages.*.
European Patent Office Search Report received for EP Application No. 11850136.0. dated Oct. 9, 2015, 5 pages.*.
European Patent Office Search Report received for EP Application No. 11850350.7. dated Oct. 6, 2015, 8 pages.*.
European Patent Office Search Report received for EP Application No. 11851579.0. dated Nov. 2, 2015, 5 pages.*.
European Patent Office Search Report received for EP Application No. 11852027.9. dated Oct. 12, 2015, 4 pages.*.
Taiwan Decision of Rejection dated Apr. 15, 2016 for Taiwan Patent Application No. 101148097. 30 pages.*.
Korean Notice of Preliminary Rejection received for Korean Patent Application No. 10-2016-7036162. dated Feb. 17, 2017, 8 pages, including English translation.

Korean Notice of Preliminary Rejection received for Korean Patent Application No. 2015-7012262. dated Jan. 18, 2017, 16 pages, including English translation.
Office Action from Chinese Patent Application No. 201610552470.8, dated Mar. 27, 2020, 8 pgs.
Notice of Allowance from Taiwan Patent Application No. 100145538, dated Apr. 29, 2016, 2 pgs.
Office Action from Japanese Patent Application No. 2018-080942 dated Mar. 5, 2019, 7 pgs.
Office Action from Japanese Patent Application No. 2017-064009, dated Dec. 5, 2017, 7 pgs.
Notice of Allowance from Japanese Patent Application No. 2017-064009, dated Mar. 20, 2018, 1 pg.
Office Action from Japanese Patent Application No. 2013-543323 dated Aug. 5, 2014, 7pgs.
Office Action from Japanese Patent Application No. 2013-543323 dated Mar. 24, 2015, 6pgs.
Office Action from Japanese Patent Application No. 2013-543323 dated May 19, 2016, 7pgs.
Office Action from Japanese Patent Application No. 2013-543323 dated Nov. 29, 2016, 4 pgs.
Office Action from Japanese Patent Application No. 2013-543323 dated Dec. 22, 2016, 1 pg.
Search Report from European Patent Application No. 19191370.6 dated Dec. 30, 2019, 10 pgs.
Stanton P. Ashburn et al: Self-Aligned Formation of C54 Titanium Germanosilicide Using Rapid Thermal Processing and Application To Raised, Ultrashallow Junctions, Materials Research Society Symposium Proceedings, vol. 320, Jan. 1, 1993 (Jan. 1, 1993), pp. 311-316, XP05563129.
Office Action from European Patent Application No. 11851579 dated Aug. 11, 2014, 10 pgs.
Office Action from European Patent Application No. 11851579 dated Nov. 23, 2018, 7pgs.
Office Action from European Patent Application No. 11851579 dated Jan. 20, 2020, 14 pgs.
Office Action from Chinese Patent Application No. 201610552470.8 dated Feb. 22, 2019, 7 pgs.
Office Action from Chinese Patent Application No. 201610552470.8 dated Dec. 8, 2019, 5 pgs.
Office Action from Chinese Patent Application No. 201180062124.7 dated Jun. 3, 2015, 12 pgs.
Office Action from Chinese Patent Application No. 201180062124.7 dated Feb. 3, 2016, 9 pgs.
Notice of Allowance from Chinese Patent Application No. 201180062124.7 dated May 5, 2016, 4 pgs.
Communication Pursuant to Article 94(3) EPC for EP Application No. 17193291.6, dated Feb. 26, 2020, pp. 3.
Communication Pursuant to Article 94(3) EPC for EP Application No. 17193291.6, dated Jun. 16, 2021, pp. 5.
Communication Pursuant to Article 94(3) EPC for EP Application No. 19188924.5, dated Jul. 14, 2020, pp. 5.
Extended European Search Report for EP Application No. 17193291.6, dated Mar. 23, 2018, pp. 9.
First Japanese Search Report for JP Application No. 2019-189786, dated Sep. 10, 2020, pp. 13.
First Taiwanese Office Action for TW Application No. 108107651, dated Aug. 15, 2021, pp. 10.
Office Action for Chinese Patent Application No. 201610313170.4 dated Oct. 23, 2020, 3 pgs.
Hellings , et al., "High Performance 70-nm Germanium pMOSFETs With Boron LDD Implants", Hellings, et al., "High Performance 70-nm Germanium pMOSFETs With Boron LDD Implants," IEEE Electron Device Letters, vol. 30, No. 1, Jan. 2009, pp. 88-90, Jan. 2009, 88-90.
Communication Pursuant to Article 94(3) EPC for EP Application No. 19188924.5, dated Oct. 14, 2021, pp. 9.

* cited by examiner

TRANSISTORS WITH HIGH CONCENTRATION OF GERMANIUM

CROSS-REFERENCE TO RELATED APPLICATIONS

This patent application is a continuation of U.S. patent application Ser. No. 15/489,569, filed Apr. 17, 2017, which is a continuation of U.S. patent application Ser. No. 14/535,387 filed on Nov. 7, 2014 (now U.S. Pat. No. 9,627,384 issued Apr. 18, 2017), which is a continuation of U.S. patent application Ser. No. 12/975,278 filed on Dec. 21, 2010 (now U.S. Pat. No. 8,901,537 issued Dec. 2, 2014). Each of these applications are herein incorporated by reference in their entirety.

BACKGROUND

Increased performance of circuit devices including transistors, diodes, resistors, capacitors, and other passive and active electronic devices formed on a semiconductor substrate is typically a major factor considered during design, manufacture, and operation of those devices. For example, during design and manufacture or forming of metal oxide semiconductor (MOS) transistor semiconductor devices, such as those used in a complementary metal oxide semiconductor (CMOS), it is often desired to increase movement of electrons in N-type MOS device (NMOS) channel regions and to increase movement of positive charged holes in P-type MOS device (PMOS) channel regions. Such increased drive current in the transistors can be achieved by reducing device resistance.

One method of reducing the overall resistance of a MOS device is to dope the area between the source/drain regions and the channel region, known as the tip regions (or sometimes as source/drain extensions) of a MOS device. For instance, a dopant may be implanted in the source/drain regions and a subsequent anneal may be carried out to diffuse the dopant towards the channel region. Because an implant and diffusion method is used, the ability to control the dopant concentration and location is limited. Furthermore, the size of other parts of a MOS device, such as the thickness of its offset spacers, can also have a great impact on the location of the tip regions. All of this, in turn, affects the ability of the tip regions to maximize dopant concentration and come into close proximity of the channel region. Accordingly, improved methods or structures are needed to overcome the limitations of conventional tip regions.

DETAILED DESCRIPTION

Techniques are disclosed for forming transistor devices having source and drain regions with high concentrations of boron doped germanium. The techniques can be used, for example, to extend self-aligned epitaxial tip (SET) transistors to achieve very near to the theoretical limit of uniaxial strain. In some embodiments, this is accomplished by use of an in situ boron doped germanium provided by selective epitaxial deposition in the source and drain regions as well as their corresponding tip regions. In other embodiments, selective epitaxial deposition is used to form a bilayer construction of boron doped silicon germanium capped with a heavily boron doped germanium layer in the source/drain and respective tip regions. In such cases, the germanium concentration can be, for example, in the range of 20 atomic % to 100 atomic %, and the boron concentration can be, for instance, in the range of $1E20$ $cm^{-3}$ to $2E21$ $cm^{-3}$ (e.g., germanium concentration in excess of 50 atomic % and boron concentration in excess of $2E20$ $cm^{-3}$). An optional thin buffer with graded germanium and/or boron concentration can be used as an interfacial layer to the underlying substrate material or materials with the layer of boron doped germanium. Likewise, in a bilayer configuration, a thin buffer with graded germanium and/or boron concentration can be used as an interfacial layer to the silicon germanium layer with the boron doped germanium cap. In still other embodiments, the boron doped germanium or silicon germanium layers themselves can have a graded germanium and/or boron concentration in a similar fashion as to the optional buffers. In any such case, since boron diffusion is suppressed in germanium (the higher the concentration, the greater the suppression), a high concentration of boron can be doped in the germanium, which in turn results in lower parasitic resistance and without degrading tip abruptness. In addition, the contact resistance is reduced from lowering of Schottky-barrier height. The techniques can be embodied, for instance, in planar or non-planar FinFET transistor devices.

General Overview

As is known, a metal oxide semiconductor (MOS) transistor may include source and drain tip regions that are designed to decrease the overall resistance of the transistor while improving short channel effects (SCE). Conventionally, these tip regions are portions of the substrate where a dopant such as boron or carbon is implanted using an implant and diffusion technique. The source tip region is formed in the area between the source region and the channel region. Likewise, the drain tip region is formed in the area between the drain region and the channel region. The tip regions resulting from such conventional processing minimally underdiffuse the gate dielectric layer of the transistor.

Figure 1A:
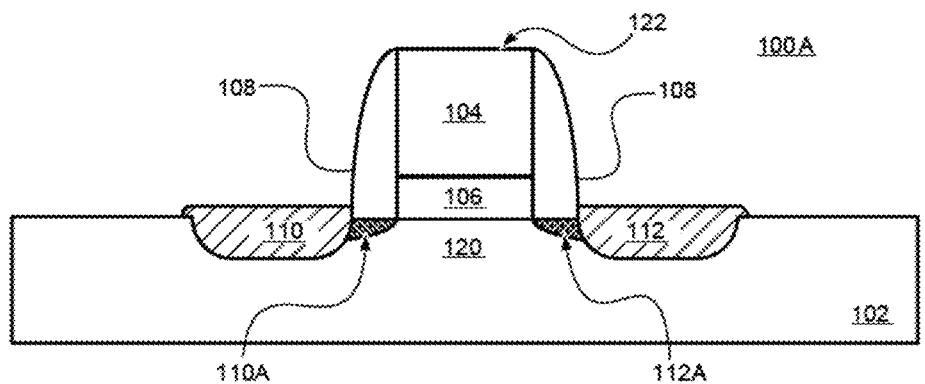
FIG. 1A illustrates a conventional MOS device that includes source and drain tip regions formed using implantation and diffusion.

In more detail, FIG. 1A illustrates a conventional MOS transistor 100A formed on a substrate 102. The source region 110 and the drain region 112 are typically formed by either implanting dopants such as boron into the substrate or by etching the substrate and then epitaxially depositing a silicon or silicon germanium material (with a germanium concentration in the range of 10 to 40 atomic %). A gate stack 122 is formed over a channel region 120 of the transistor 100A. As can further be seen, the gate stack 122 includes a gate dielectric layer 106 and a gate electrode 104, and spacers 108 are formed adjacent to the gate stack 122. In some example cases, and depending on the technology node, the spacers 108 create a distance of about 10 to 20 nanometers (nm) between the edges of the gate dielectric layer 106 and the edges of each of the source and drain regions 110/112. It is within this space that a source tip region 110A and a drain tip region 112A are formed. As can be seen, the implantation-diffusion based tip regions 110A/112A overlap the spacers 108 and may also overlap or underdiffuse the gate dielectric layer 106 by a distance of less than 10 nm. In forming the implantation-diffusion based tip regions 110A/112A, a dopant such as boron or carbon is implanted into the source region 110 and the drain region 112. The transistor 100A is then annealed to cause the dopant to diffuse towards the channel region 120. Angled ion implantation techniques may also be used to further implant dopants into those areas between the gate dielectric layer 106 and the source/drain regions 110/112. Unfortunately, factors such as the shape of the tip regions 110A/112A, the distance the dopants penetrate below the spacers 108, and the concentration gradient of the tip regions 110A/112A are dependent on the diffusion properties of the dopant in the substrate material. For instance, the concentration of the tip regions will be high proximate to the source/drain region 110/112 and low proximate to the channel region 120. Although highly desired, it is nearly impossible to make the dopant concentration proximate to the channel region 120 very high without driving the dopant into the channel region 120. Furthermore, the source and drain regions 110/112 cannot be moved closer to the channel region 120 because the dopant may again be driven into the channel region 120. This limits how close the source and drain regions 110/112 can be formed to the channel region 120, thereby constraining gate length scaling.

Figure 1B:
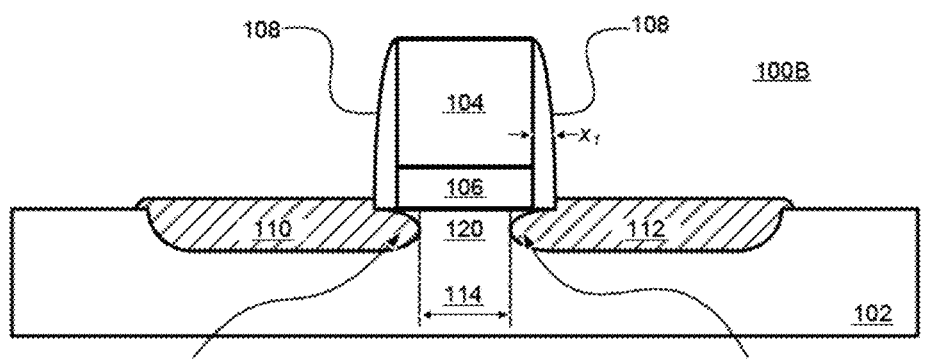
FIG. 1B illustrates a MOS device that includes source and drain epitaxial tips configured in accordance with an embodiment of the present invention.

FIG. 1B illustrates an example MOS device 100B that includes source and drain epitaxial tips (generally referred to herein as epi-tips) configured in accordance with an embodiment of the present invention. In more detail, the MOS transistor 100B uses an undercut etch to allow the source region 110 and the drain region 112 to extend below the spacers 108, and in some cases, below the gate dielectric layer 106. The portions of the source/drain regions 110/112 that extend below the spacers 108 (and possibly the gate dielectric layer 106) are referred to herein as the source epi-tip 110B and the drain epi-tip 112B, respectively. The source and drain epi-tips 110B/112B replace the implantation/diffusion based tip regions 110A/112A described with regard to FIG. 1A.

In accordance with an embodiment of the present invention, the source/drain regions 110/112 and the source/drain epi-tips 110B/112B can be formed, for example, by etching the substrate 102, which includes undercutting the spacers 108 (and possibly the gate dielectric layer 106), and then using selective epitaxial deposition to provide an in situ boron doped germanium, or boron doped silicon germanium (SiGe) capped with heavily boron doped germanium, to fill the source/drain regions 110/112 and the source/drain epi-tips 110B/112B, as shown in FIG. 1B. Note the epitaxial fill may be raised relative to the surface of substrate 102, as further shown in FIG. 1B.

In accordance with some embodiments of the present invention, a graded buffer may be used in one or more locations of the structure, depending on factors such as the substrate composition and extent to which misfit dislocation is to be inhibited between disparate layers of the device structure. For instance, the substrate 102 can be a silicon substrate, or a silicon film of a silicon on insulator (SOI) substrate, or a multi-layered substrate comprising silicon, silicon germanium, germanium, and/or III-V compound semiconductors. Thus, and by way of example, in an embodiment having a silicon or silicon germanium substrate 102 and an in situ boron doped germanium which is used to fill the source/drain regions 110/112 and the source/drain epi-tips 110B/112B, a buffer can be provided between the underlying substrate 102 and the upper boron doped germanium. In such an embodiment, the buffer can be a graded boron doped (or intrinsic) silicon germanium layer with the germanium composition graded from a base level concentration compatible with the underlying silicon substrate or silicon germanium substrate up to 100 atomic % (or near 100 atomic %, such as in excess of 90 atomic % or 95 atomic % or 98 atomic %). In one specific such embodiment, the germanium concentration ranges from 40 atomic % or less to in excess of 98 atomic %. The boron concentration within this buffer can be fixed, for example, at a high level or grade, for example, from a base concentration at or otherwise compatible with the underlying substrate up to a desired high concentration (e.g., in excess of $1E20$ $cm^{-3}$, or $5E20$ $cm^{-3}$). Note that compatibility as used herein does not necessitate an overlap in concentration levels (for instance, the germanium concentration of the underlying substrate can be 0 to 20 atomic % and initial germanium concentration of the buffer can be 30 to 40 atomic %). In addition, as used herein, the term 'fixed' with respect to a concentration level is intended to indicate a relatively constant concentration level (e.g., the lowest concentration level in the layer is within 10% of the highest concentration level within that layer). In a more general sense, a fixed concentration level is intended to indicate the lack of an intentionally graded concentration level. The thickness of the buffer can vary depending on factors such as the range of concentrations being buffered, but in some embodiments is in the range of 30 to 120 Angstroms (Å), such as 50 to 100 Å (e.g., 60 Å or 65 Å). As will be appreciated in light of this disclosure, such a graded buffer beneficially lowers the Schottky-barrier height.

Alternatively, rather than using a thin buffer between the underlying substrate 102 and the upper boron doped germanium, the boron doped germanium layer itself can be graded in a similar fashion. For example, and in accordance with one example embodiment, the boron doped germanium layer can be configured with a germanium concentration graded from a base level concentration compatible with the underlying substrate (e.g., in the range of 30 to 70 atomic %) up to 100 atomic %. In some such embodiments, the boron concentration within this boron doped germanium layer can range, for example, from a base concentration at or otherwise compatible with the underlying substrate up to a desired high concentration (e.g., in excess of $1E20$ $cm^{-3}$).

In other embodiments having a silicon or silicon germanium substrate 102 and a bilayer structure of an in situ boron doped SiGe and boron doped germanium cap filling the source/drain regions 110/112 and the source/drain epi-tips 110B/112B, a buffer can be provided between the boron doped SiGe layer and the upper boron doped germanium cap. In one such embodiment, the boron doped SiGe layer has a fixed concentration of germanium (e.g., in the range of 30 to 70 atomic %) and the buffer can be a thin SiGe layer (e.g., 30 to 120 Å, such as 50 to 100 Å) having a germanium concentration graded from a base level concentration compatible with the underlying boron doped SiGe layer up to 100 atomic % (or near 100 atomic %, such as in excess of 90 atomic % or 95 atomic % or 98 atomic %). In some such cases, the boron concentration within this buffer can be fixed, for example, at a high level or can range, for example, from a base concentration at or otherwise compatible with the underlying SiGe layer up to a desired high concentration (e.g., in excess of $1E20\ cm^{-3}$, $2E20\ cm^{-3}$, $3E20\ cm^{-3}$, $4E20\ cm^{-3}$, or $5E20\ cm^{-3}$).

Alternatively, rather than using a thin buffer between the two layers of the bilayer structure, the boron doped SiGe layer itself can be graded in a similar fashion. For example, and in accordance with one example embodiment, the boron doped SiGe layer can be configured with a germanium concentration graded from a base level concentration compatible with the underlying substrate (e.g., in the range of 30 to 70 atomic %) up to 100 atomic % (or near 100 atomic %, as previously explained). The boron concentration within this boron doped SiGe layer can be fixed, for example, at a high level or can range, for example, from a base concentration at or otherwise compatible with the underlying substrate up to a desired high concentration (e.g., in excess of $1E20\ cm^{-3}$).

Thus, a SET architecture for planar and non-planar FinFET transistor devices is provided. The devices may be formed in part using conventional processes such as, for example, by dummy gate oxide, thin spacer, and an isotropic undercut etch (or an ammonia etch to form faceted fin recess in monocrystalline substrate, or other suitable etch to form fin recess). In accordance with some embodiments, selective epitaxial deposition can then be used to provide in situ boron doped germanium or, alternatively, a fully strained boron doped silicon germanium layer capped with heavily boron doped pure germanium, to form both tips and source/drain regions. Optional buffers may be used as previously explained. With such embodiments, no P-type source and drain (PSD) implants or high temperature diffusion-based anneals are required, since boron is fully active as deposited. Any suitable high-k replacement metal gate (RMG) process flow can also be used, where a high-k dielectric replaces the dummy gate oxide. Silicidation with, for example, nickel, nickel-platinum, or titanium with or without germanium pre-amorphization implants can be used to form a low resistance germanide. As previously explained, such embodiments extend SET transistor device architecture to achieve (near) theoretical limit of uniaxial strain. The techniques provided herein can be applied, for example, to benefit any technology nodes (e.g., 90 nm, 65 nm, 45 nm, 32 nm, 22 nm, 14 nm, and 10 nm transistors, and lower), and the claimed invention is not intended to be limited to any particular such nodes or range of device geometries. Other advantages will be apparent in light of this disclosure.

For instance, note that the source and drain epi-tips 110B/112B configured in accordance with an embodiment of the present invention can be formed in the same process as the source and drain regions 110/112, which reduces process time. In addition, unlike conventional implantation/diffusion based tip regions, the lattice parameter of the source/drain epi-tips 110B/112B configured in accordance with an embodiment of the present invention induces a strain in the channel region 120 that increases hole mobility and therefore decreases resistance in the channel. Another advantage of a SET architecture configured in accordance with some embodiments of the present invention is that the interface between the source/drain epi-tips 110B and 112B and the substrate material 102 that forms the channel region 120 is abrupt. For instance, on one side of the interface is the epitaxially deposited boron doped germanium (B:Ge) material (e.g., with B concentration in excess of $2E20\ cm^{-3}$ or $5E20\ cm^{-3}$) and on the other side of the interface is the substrate material that makes up the channel region 120 (e.g., silicon germanium, or other suitable substrate material). This structure enables the epitaxial source/drain epi-tips 110B/112B to bring the heavily boron doped high concentration germanium material in very close proximity to the channel region 120. The boron in the epitaxial source/drain epi-tips 110B/112B remains substantially or completely within the epi-tips and does not tend to diffuse into the channel region 120.

Figure 1C:
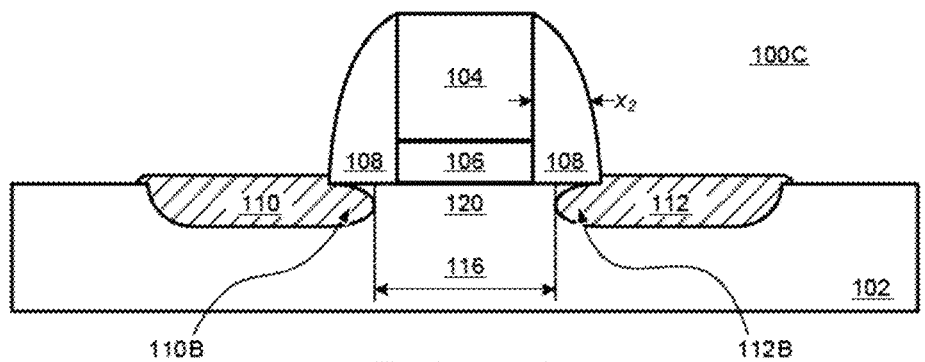
FIG. 1C illustrates how spacer thickness can impact etching of epitaxial tips of a MOS device.
Figure 1D:
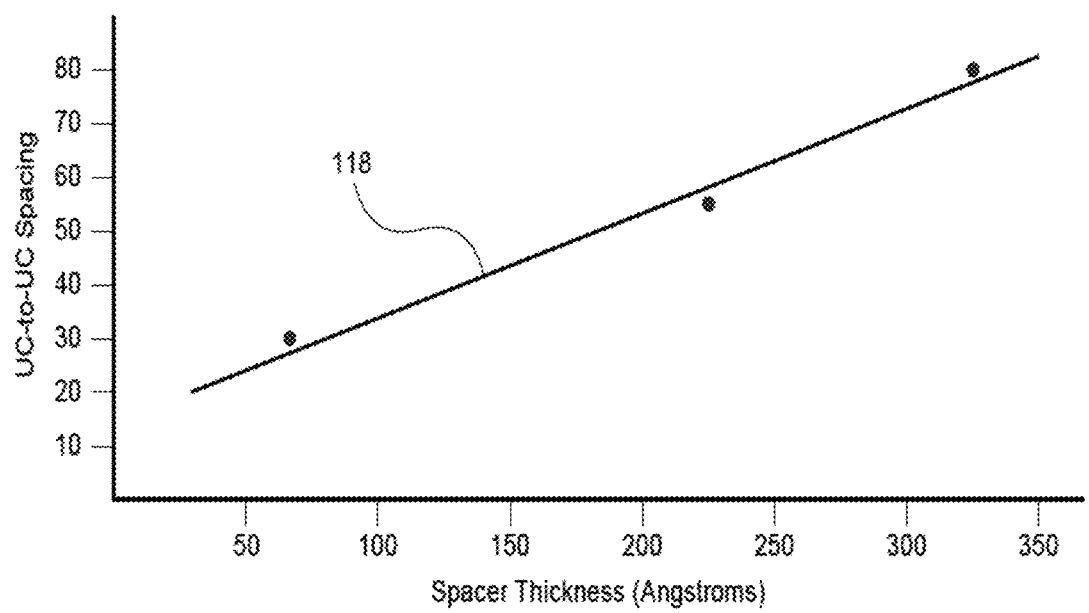
FIG. 1D is a graph illustrating the dependence of UC-to-UC distance on spacer thickness.

Conventional methods that can be used in forming the source and drain epi-tips 110B/112B can have issues that should be considered. In particular, and with reference to FIGS. 1B and 1C, conventional undercut etching techniques may result in the formation of a bulleted profile for the undercut region. In such cases, more of the substrate material is etched a slight distance below the gate dielectric layer 106 than is etched directly adjacent to the gate dielectric layer 106. As such, the source epi-tip 110B and the drain epi-tip 112B each conform to that bulleted profile, which may produce a less than optimal strain in the channel region 120. Furthermore, variance in conventional undercut etching techniques can translate into a variance in the resulting source and drain epi-tips 110B/112B that are formed. Another issue with conventional methods of forming source and drain epi-tips 110B/112B concerns the effect that spacer thickness has on the undercut etch, as shown in FIGS. 1B and 1C. With reference to FIG. 1B, the MOS transistor 100B is shown having offset spacers 108 of a first thickness $x_1$. A substrate etch has been performed that undercuts the spacers 108 and a portion of the gate dielectric layer 106 to enable the formation of source and drain epi-tips 110B/112B. An undercut-to-undercut (UC-to-UC) distance 114 separates source epi-tip 110B from drain epi-tip 112B. With reference to FIG. 1C, a MOS transistor 100C is shown with offset spacers 108 having a thickness $x_2$. Here, the thickness $x_2$ is much greater than the thickness $x_1$ of the spacers 108 in FIG. 1B. As a result, when the substrate etch is performed, the thicker spacers 108 push out the undercut etch and cause the source/drain epi-tips 110B/112B to be formed further away from the channel region 120 of the transistor 100C. The substrate etch therefore undercuts less of the surface area beneath the MOS transistor 100C. Accordingly, a UC-to-UC distance 116 for the MOS transistor 100C is much larger than the UC-to-UC distance 114 for the MOS transistor 100B. Altering the UC-to-UC distance in this manner yields large drive current variations for MOS transistors. FIG. 1D is a graph illustrating how spacer thickness affects the UC-to-UC distance in devices formed using known methods. The graph provides data, represented by line 118, showing that as spacer thickness increases, the UC-to-UC distance also increases, leading to large drive current variations. Typically, for every nanometer of spacer thickness increase, the UC-to-UC distance increases by around 2 nm.

In this sense, forming source/drain epi-tips using conventional methods at least in some cases permits the thickness of the offset spacers to have a significant impact on the performance of the MOS device. As will be appreciated in light of this disclosure, some embodiments of the present invention provide methods of forming self-aligned and epitaxially deposited source and drain tips that address such issues.

Architecture and Methodology

Figure 2:
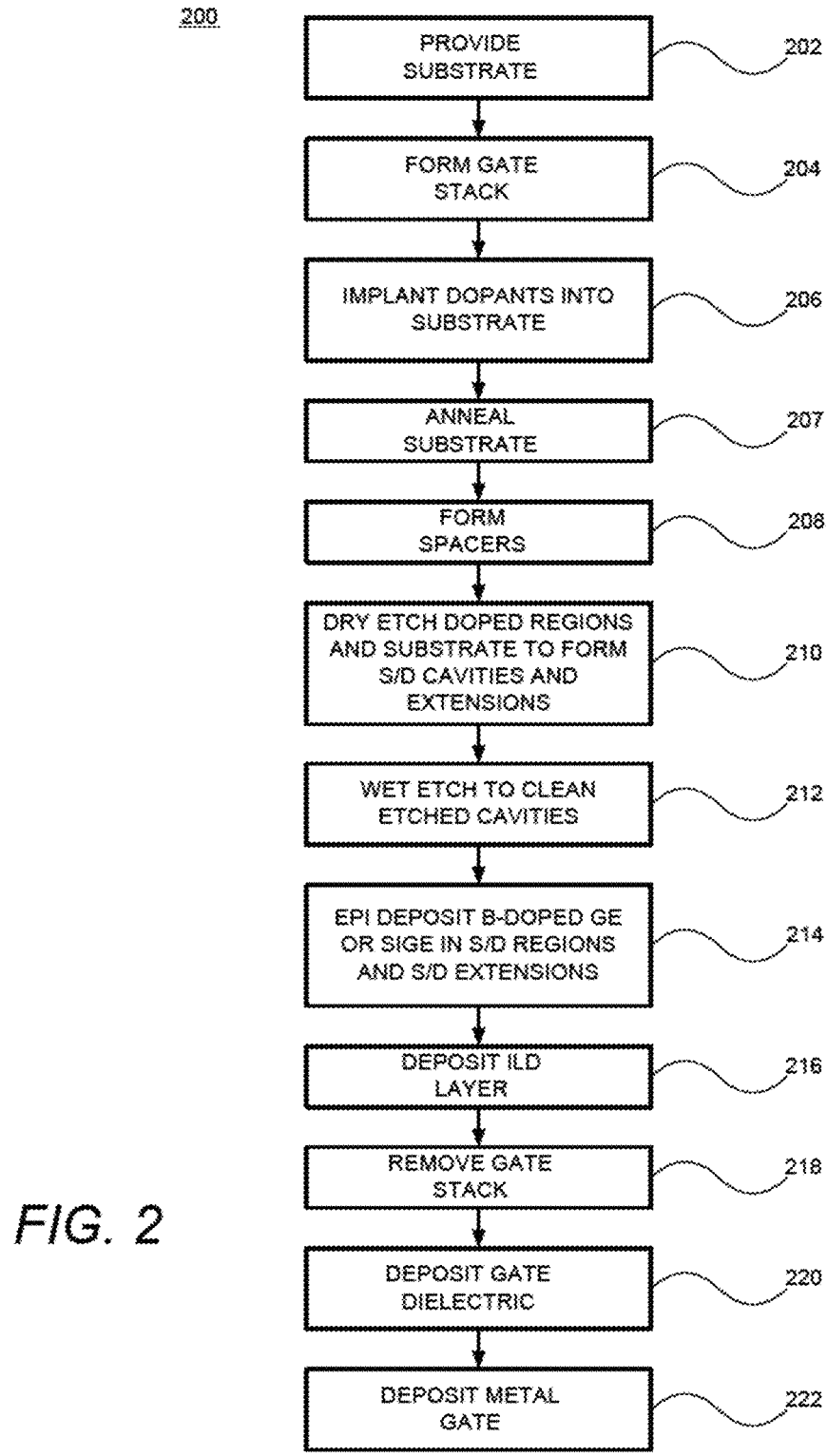
FIG. 2 is a method of forming source and drain epitaxial tips in accordance with an embodiment of the present invention.

FIG. 2 is a method 200 of building a MOS transistor with self-aligned source and drain epi-tips, in accordance with an embodiment of the present invention. FIGS. 3A through 3J illustrate example structures that are formed as the method 200 is carried out, and in accordance with some embodiments.

As can be seen, the method 200 begins with providing 202 a semiconductor substrate upon which a MOS device, such as a PMOS transistor, may be formed. The semiconductor substrate may be implemented, for example, with a bulk silicon or a silicon-on-insulator configuration. In other implementations, the semiconductor substrate may be formed using alternate materials, which may or may not be combined with silicon, such as germanium, silicon germanium, indium antimonide, lead telluride, indium arsenide, indium phosphide, gallium arsenide, or gallium antimonide. In a more general sense, any material that may serve as a foundation upon which a semiconductor device may be built can be used in accordance with embodiments of the present invention.

The method 200 continues with forming 204 a gate stack on the semiconductor substrate. The gate stack can be formed as conventionally done or using any suitable custom techniques. In some embodiments of the present invention, the gate stack may be formed by depositing and then patterning a gate dielectric layer and a gate electrode layer. For instance, in one example case, a gate dielectric layer may be blanket deposited onto the semiconductor substrate using conventional deposition processes such as chemical vapor deposition (CVD), atomic layer deposition (ALD), spin-on deposition (SOD), or physical vapor deposition (PVD). Alternate deposition techniques may be used as well; for instance, the gate dielectric layer may be thermally grown. The gate dielectric material may be formed, for example, from materials such as silicon dioxide or high-k dielectric materials. Examples of high-k gate dielectric materials include, for instance, hafnium oxide, hafnium silicon oxide, lanthanum oxide, lanthanum aluminum oxide, zirconium oxide, zirconium silicon oxide, tantalum oxide, titanium oxide, barium strontium titanium oxide, barium titanium oxide, strontium titanium oxide, yttrium oxide, aluminum oxide, lead scandium tantalum oxide, and lead zinc niobate. In some specific example embodiments, the high-k gate dielectric layer may be between around 5 Å to around 200 Å thick (e.g., 20 Å to 50 Å). In general, the thickness of the gate dielectric layer should be sufficient to electrically isolate the gate electrode from the neighboring source and drain contacts. In further embodiments, additional processing may be performed on the high-k gate dielectric layer, such as an annealing process to improve the quality of the high-k material. Next, a gate electrode material may be deposited on the gate dielectric layer using similar deposition techniques such as ALD, CVD, or PVD. In some such specific embodiments, the gate electrode material is polysilicon or a metal layer, although other suitable gate electrode materials can be used as well. The gate electrode material, which is typically a sacrificial material that is later removed for a replacement metal gate (RMG) process, has a thickness in the range of 50 Å to 500 Å (e.g., 100 Å), in some example embodiments. A conventional patterning process may then be carried out to etch away portions of the gate electrode layer and the gate dielectric layer to form the gate stack, as shown in FIG. 3A.

Figure 3A:
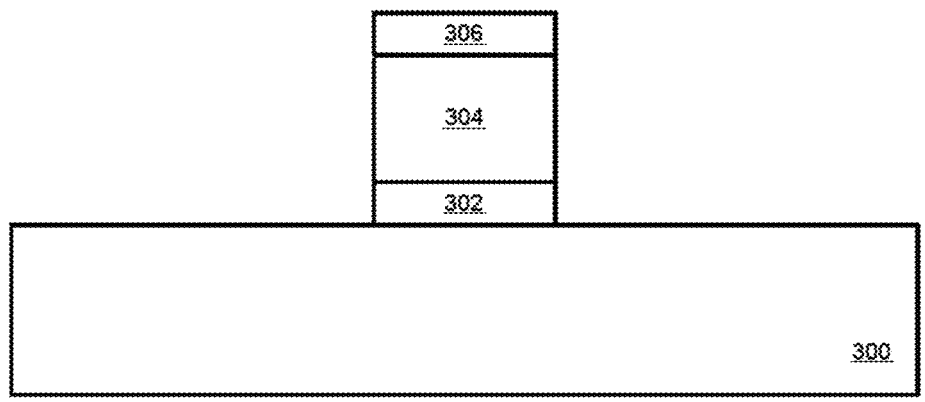
FIGS. 3A to 3J illustrate structures that are formed when carrying out the method of FIG. 2, in accordance with various embodiments of the present invention.

FIG. 3A illustrates a substrate 300 upon which a gate stack is formed. As can be seen with this example embodiment, the gate stack includes a gate dielectric layer 302 (which may be high-k gate dielectric material) and a sacrificial gate electrode 304. In one specific example case, the gate stack includes a silicon dioxide gate dielectric layer 302 and a polysilicon gate electrode 304. The gate stack may also include a gate hard mask layer 306 that provides certain benefits or uses during processing, such as protecting the gate electrode 304 from subsequent ion implantation processes. The hard mask layer 306 may be formed using typical hard mask materials, such as such as silicon dioxide, silicon nitride, and/or other conventional dielectric materials.

With further reference to FIG. 2, after the gate stack is formed, the method 200 continues with an ion implantation process to highly dope portions of the substrate adjacent to the gate stack, by implanting 206 dopants into the substrate. The dopant used in the ion implantation process can be chosen, for example, based on its ability to increase the etch rate of the substrate material in which it is implanted, and the specific dopant selected for the ion implantation process may vary based on the substrate material(s) and the etchant used in a subsequent etching process. Specific dopants that may be selected to increase the etch rate of the substrate include, for example, carbon, phosphorous, and arsenic. For instance, carbon may be used at a dosage that ranges from $1 \times 10^{14}$ to $1 \times 10^{16}$ atoms/cm$^3$ using an implantation energy that falls between 5 and 15 kilo-electron volts (keV). Phosphorous may be used at a dosage that ranges from $1 \times 10^{14}$ to $5 \times 10^{15}$ atoms/cm$^3$ using an implantation energy that falls between 1 and 5 keV. Arsenic may be used at a dosage that ranges from $1 \times 10^{14}$ to $5 \times 10^{15}$ atoms/cm$^3$ using an implantation energy that falls between 2 and 5 keV. Other suitable dopants and dosage schemes will be apparent in light of this disclosure. In some embodiments, the ion implantation substantially occurs in a vertical direction (i.e., a direction perpendicular to substrate), while in other embodiments at least a portion of the ion implantation process occurs in an angled direction to implant ions below the gate stack. Note that the hard mask 306 can be used to prevent doping of the gate electrode 304 material.

Next, the method 200 continues with annealing 207 the substrate to drive the dopants further into the substrate and to reduce any damage sustained by the substrate during the ion implantation process. In some embodiments, the implanting 206 and subsequent annealing 207 may drive the ions to a substrate depth that falls, for example, between 2 nm and 20 nm. The annealing 207 may be carried out at a temperature that falls, for example, between 700° C. and 1100° C. for a time duration of up sixty seconds or less (e.g., five seconds). As will be appreciated, the annealing temperature and duration can vary from one embodiment to the next, depending on factors such as the diffusion rate, substrate material, dopant used, and desired end dopant concentration.

Figure 3B:
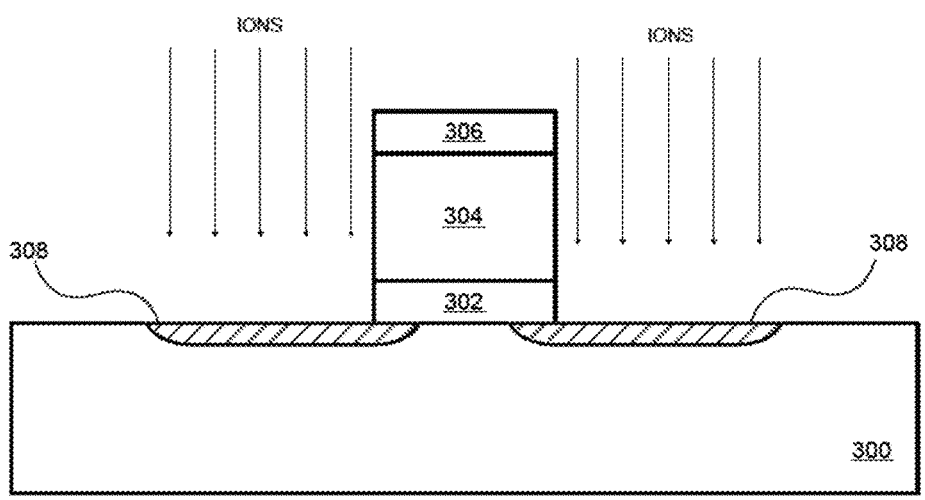

FIG. 3B illustrates the substrate 300 after the ion implantation and diffusion process. As shown in this example embodiment, the ion implantation process creates two doped regions 308 adjacent to the gate dielectric layer 302, for the MOS transistor being formed. When exposed to an appropriate etchant, the doped regions 308 will have an etch rate that is higher than the etch rate of the surrounding substrate material. One of the doped regions 308 will serve as a portion of a source region, including its self-aligned epi-tip. The other doped region 308 will serve as a portion of a drain region, including its self-aligned epi-tip. In the example embodiment shown, portions of the doped regions 308 are sited below the gate dielectric layer 302. Note that the size of the doped regions 308, including their depth, may vary based on the requirements of the MOS transistor being formed.

Figure 3C:
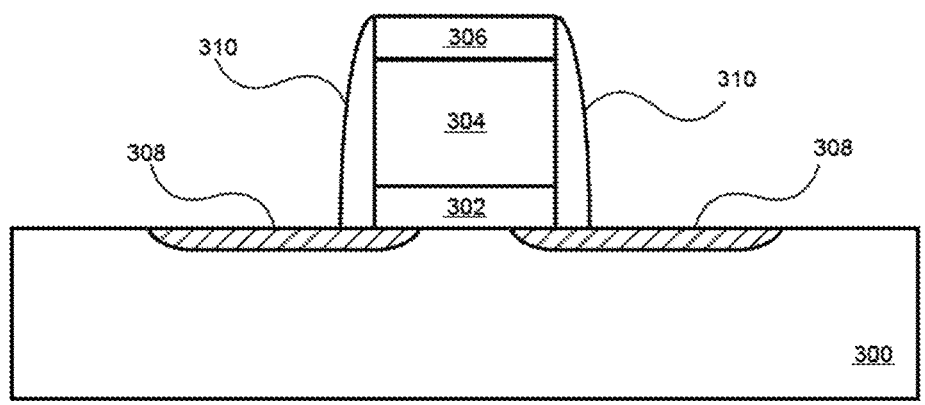

Next, the method 200 continues with forming 208 spacers on either side of the gate stack. The spacers may be formed, for example, using conventional materials such as silicon oxide, silicon nitride, or other suitable spacer materials. The width of the spacers may generally be chosen based on design requirements for the MOS transistor being formed. In accordance with some embodiments, however, the width of the spacers is not subject to design constraints imposed by the formation of the source and drain epi-tips. FIG. 3C illustrates the substrate 300 with spacers 310 formed on either side of the gate electrode layer 304 and the gate dielectric layer 302, in accordance with an example embodiment.

With further reference to FIG. 2, the method 200 continues with dry etching 210 the doped regions of the substrate to form cavities in which source/drain regions including their respective epi-tips may be formed. As best seen with reference to FIG. 3D, the etched cavities are generally adjacent to the gate stack, and the epi-tip areas are effectively extensions of the source/drain cavity regions. In some example embodiments, the etched cavities may be formed to a depth that falls between 50 nm and 1500 nm, which can be deeper than the doped regions. In a more general sense, the etch depth can be set as needed, based on desired MOS device performance. In some embodiments, the dry etch process can use an etchant recipe that complements the dopant used in the ion implantation process to increase the etch rate of the doped regions, thereby enabling the etching process to remove substrate material from the doped regions at a faster rate than the remainder of the substrate 300. In some embodiments, this includes portions of the doped regions that undercut the spacers 310 and the gate dielectric layer 302, thereby defining the self-aligned tip architecture of the transistor. Increasing the etch rate of the doped regions enables the etched source and drain tip cavities to undercut the spacers 310 and the gate dielectric layer 302 without the UC-to-UC distance being substantially impacted by factors such as the thickness of the spacers, variations in the dry etch process, and other process variations.

In accordance with some embodiments, the dry etch process may use a chlorinated chemistry that takes place in a plasma reactor. In some specific such embodiments, the etchant recipe may include a combination of $NF_3$ and $Cl_2$ with argon or helium used as a buffer or carrier gas. In accordance with some such embodiments, the flow rate for the active etchant species may vary, for example, between 50 and 200 standard cubic centimeters per minute (SCCM) while the flow rate of the carrier gas may vary, for example, between 150 and 400 SCCM. A high energy plasma may be employed at a power that ranges, for instance, from 700 W to 1100 W with a low RF bias of less than 100 W, in accordance with some such embodiments. The reactor pressure may range from around 1 pascal (Pa) to around 2 Pa, in accordance with some such embodiments. In another specific example embodiment, the etchant chemistry may include a combination of HBr and $Cl_2$. In some such embodiments, the flow rate for the etchant species may vary, for example, between 40 SCCM and 100 SCCM. A high energy plasma may be employed at a power that ranges from around 600 W to around 1000 W with a low RF bias of less than 100 W, and the reactor pressure may range from around 0.3 Pa to around 0.8 Pa, in accordance with some such embodiments. In yet another example embodiment, the etchant chemistry may include a combination of Ar and $Cl_2$. In some such embodiments, the flow rate for the etchant species may vary, for example, between 40 SCCM and 80 SCCM. A medium energy plasma may be employed at a power that ranges from around 400 W to around 800 W with a high RF bias of between around 100 W and 200 W, and the reactor pressure may range from around 1 Pa to around 2 Pa, in accordance with some such embodiments. The dry etch process times for each of these example embodiments may be, for example, up to 60 seconds per substrate, but can vary depending on factors such as desired etch depth and etchant. Such etch process parameters may vary, as will be appreciated.

Figure 3D:
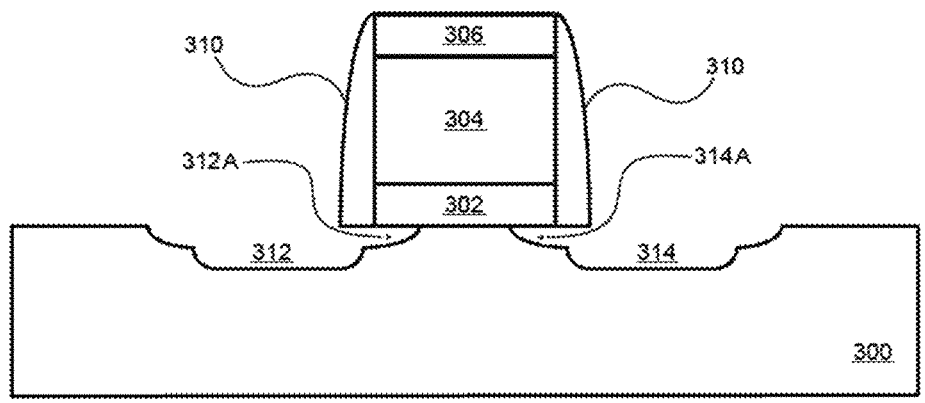

FIG. 3D illustrates the substrate 300 after the dry etch process has been carried out, in accordance with some embodiments of the present invention. As shown, a source region cavity 312 and a drain region cavity 314 are formed. In addition, a source tip cavity 312A and a drain tip cavity 314A have been formed as extensions of cavities 312 and 314, respectively, by the etching 210 of the doped regions as previously discussed. Note that the thickness of the spacers 310 has minimal impact on the etching of the source tip cavity 312A and the drain tip cavity 314A due to the use of dopants and etchant recipes that increase the etch rate of the doped regions during etching 210.

Figure 3E:
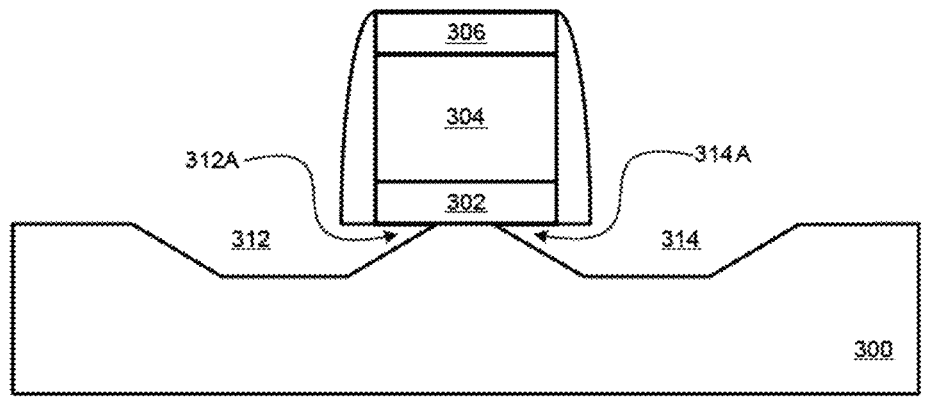

After the dry etch process has completed, and with further reference to FIG. 2, the method of this example embodiment continues with wet etching 212 to clean and further etch the source region cavity 312 and its source epi-tip cavity 312A, as well as the drain region cavity 314 and its drain epi-tip cavity 314A. The wet etching 212, which can be carried out using conventional or custom wet etch chemistries, can be used to remove contaminants such as carbon, fluorine, chlorofluorocarbons, and oxides such as silicon oxide to provide a clean surface upon which subsequent processes may be carried out. In addition, and assuming a monocrystalline silicon substrate, the wet etching 212 may also be used to remove a thin portion of the substrate along the <111> and <001> crystallographic planes to provide a smooth surface upon which a high quality epitaxial deposition may occur. In some example cases, the thin portion of the substrate that is etched away may be, for example, up to 5 nm thick and may also remove residual contaminants. As best shown in FIG. 3E, the wet etching 212 causes edges of the source region cavity 312 and its epi-tip region 312A, as well as the drain region cavity 314 and its epi-tip region 314A to follow the <111> and <001> crystallographic planes. Further note that the source and drain epi-tip regions 312A and 314A do not have the bulleted profile that occurs in conventional processing.

After the wet etch process has completed, and with further reference to FIG. 2, the method 200 continues with epitaxially depositing 214 in the source/drain and respective tip cavities either an in situ boron doped germanium (with an intervening thin buffer in some cases), or boron doped silicon germanium capped with a heavily boron doped germanium layer. This epitaxial deposition fills the source and drain cavities including their respective epi-tip regions in one process, in accordance with some embodiments. A CVD process or other suitable deposition technique may be used for the depositing 214. For example, the depositing 214 may be carried out in a CVD reactor, an LPCVD reactor, or an ultra-high vacuum CVD (UHVCVD) reactor. In some example cases, the reactor temperature may fall, for instance, between 600° C. and 800° C. and the reactor pressure may fall, for instance, between 1 and 760 Torr. The carrier gas may include, for example, hydrogen or helium at a suitable flow rate, such as between 10 and 50 SLM. In some specific embodiments, the deposition may be carried out using a germanium source precursor gas such as $GeH_4$ that is diluted in $H_2$ (e.g., the $GeH_4$ may be diluted at 1-5%). For instance, the diluted $GeH_4$ may be used at a 1% concentration and at a flow rate that ranges between 50 and 300 SCCM. For an in situ doping of boron, diluted $B_2H_6$ may be used (e.g., the $B_2H_6$ may be diluted in $H_2$ at 1-5%). For instance, the diluted $B_2H_6$ may be used at a 3% concentration and at a flow rate that ranges between 10 and 100 SCCM. In some example cases, an etching agent may be added to increase the selectivity of the deposition. For instance, HCl or $Cl_2$ may be added at a flow rate that ranges, for example, between 50 and 300 SCCM.

Figure 3F:
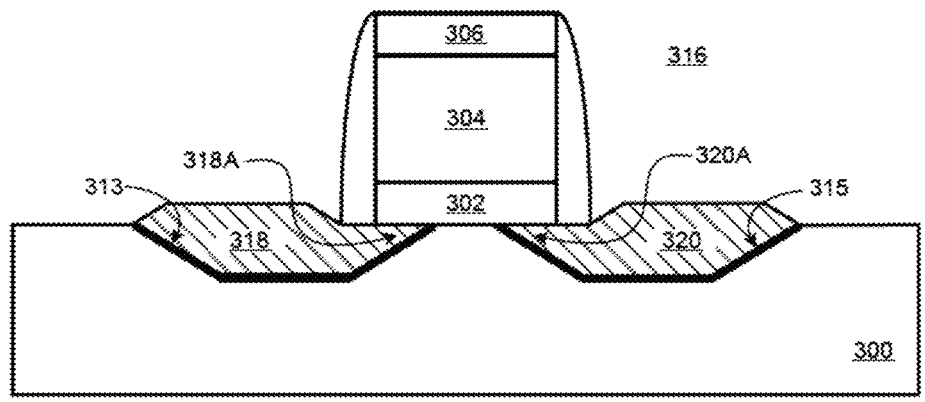

In accordance with some example embodiments of the present invention, and as best shown in FIG. 3F, the source and drain region cavities 312/314 along with their respective tip regions 312A/314A are filled with in situ boron doped germanium, thereby forming source region 318 (along with source epi-tip 318A) and drain region 320 (along with drain epi-tip 320A) of a MOS transistor 316 in substrate 300. In some such embodiments, the boron doped germanium has a boron concentration in excess of $5E20$ $cm^{-3}$, such as $2E21$ $cm^{-3}$ or higher. The thickness of the boron doped germanium deposited layer may range, for example, from 50 to 500 nm (e.g., 120 nm), in accordance with some specific embodiments, although other layer thicknesses will be apparent in light of this disclosure. As previously explained, some such embodiments may include a thin buffer between the pure germanium layer and the substrate. For instance, and as can further be seen in the example embodiment shown in FIG. 3F, a source buffer 313 and a drain buffer 315 are deposited prior to depositing the in situ boron doped germanium. In some such embodiments, the buffers 313 and 315 can be a graded boron doped silicon germanium layer with the germanium composition graded from a base level concentration compatible with the underlying substrate 300 material up to 100 atomic % (or near to 100 atomic as previously described). The thickness of the buffers 313 and 315 will vary depending on factors such as the concentration range over which the buffer transitions and the make-up of the underlying substrate 300. In one example embodiment having a silicon germanium substrate, the buffer thickness ranges from 2 nm to 10 nm, although other suitable thicknesses can be used also. In one specific such embodiment, the boron concentration within the buffers 313 and 315 can range, for example, from a base concentration compatible with the underlying silicon germanium substrate up to a desired concentration (e.g., in excess of $1E20$ $cm^{-3}$ and up to $2E21$ $cm^{-3}$), with two specific embodiments being in excess of $2E20$ $cm^{-3}$ or in excess of $5E20$ $cm^{-3}$. In a more general sense, the boron concentration can be adjusted as necessary to provide the desired degree of conductivity, as will be appreciated in light of this disclosure.

Figure 3G:
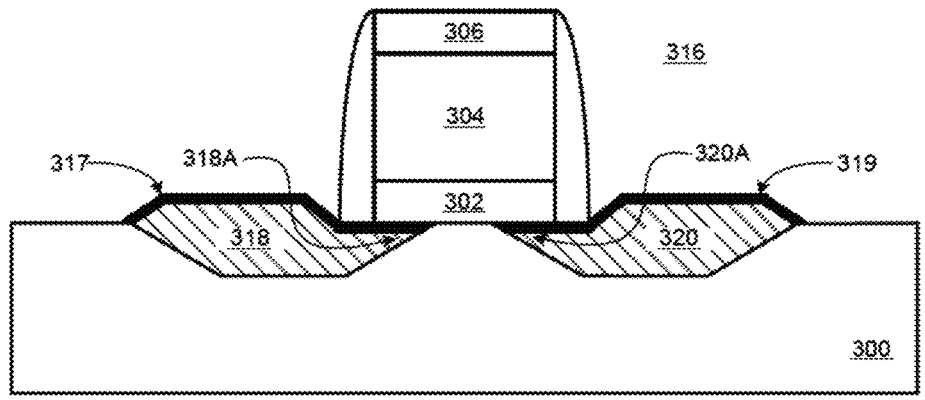

In accordance with other example embodiments of the present invention, and as best shown in FIG. 3G, the source and drain region cavities 312/314 along with their respective tip regions 312A/314A are filled with in situ boron doped silicon germanium to form source region 318 (along with source epi-tip 318A) and drain region 320 (along with drain epi-tip 320A) of MOS transistor 316 in substrate 300. The boron doped silicon germanium fill is then capped with a heavily boron doped germanium layer to provide source cap 317 and drain cap 319. In some such bilayer construction embodiments, the boron doped silicon germanium fill, which may be epitaxially deposited in one or more layers, has a germanium concentration in the range of 30 to 70 atomic %, or higher. As previously explained, this germanium concentration of the SiGe fill may be fixed or graded so as to increase from a base level (near substrate 300) to a high level (e.g., in excess of 50 atomic %, near the pure germanium cap 317/319). The boron concentration in some such embodiments can be in excess of $1E20$ $cm^{-3}$, such as higher than $5E20$ $cm^{-3}$ or $2E21$ $cm^{-3}$, and may also be graded so as to increase from a base level near substrate 300 to a high level (e.g., in excess of $1E20$ $cm^{-3}$ or $2E20$ $cm^{-3}$ or $3E20$ $cm^{-3}$, etc., near cap 317/319). In embodiments where the germanium concentration of the boron doped SiGe layer is fixed, a thin graded buffer may be used to better interface the boron doped SiGe layer with the boron doped Ge cap, as previously explained. The thickness of the boron doped SiGe deposited layer (or collection of layers) 318/320 may range, for example, from 50 to 250 nm (e.g., 60 nm), and the pure germanium cap 317/319 may have a thickness in the range, for example, of 50 to 250 nm (e.g., 50 nm), in accordance with some specific embodiments, although alternative embodiments may have other layer and cap thicknesses, as will be apparent in light of this disclosure. In some embodiments, note that cavities may be created underneath the spacers during cyclical deposition-etch processing, and those cavities can be backfilled by an epitaxial cap layer as well (which can have, for example, the same composition as the boron doped germanium cap 317/319).

As will further be appreciated in light of this disclosure, the combination of high germanium concentration (e.g., in excess of 50 atomic % and up to pure germanium) and high boron concentration (e.g., in excess of $1E20$ $cm^{-3}$), such as discussed with respect to embodiments shown in FIGS. 3F and 3G, can be used to realize significantly higher conductance in the source and drain regions as well as their respective tip regions in PMOS SET transistor devices. Further, and as previously explained, since boron diffusion is sufficiently suppressed by pure germanium, no adverse SCE degradation is realized with subsequent thermal anneals despite high boron in the deposited stressor film. Barrier height lowering is also enabled from the higher concentration of germanium at the contact surface. In some example embodiments, a germanium concentration in excess of 95 atomic % and up to pure germanium (100 atomic %) can be used to achieve such benefits.

As further shown in FIGS. 3F and 3G, unlike conventional source and drain tip regions that are formed through implant and diffusion techniques and therefore have no clear boundary between the tip regions and the channel region, the self-aligned source and drain epi-tips of the MOS transistor 316 have an abrupt boundary. In other words, the interface between the source/drain epi-tips and the channel region is clear and well-defined. On one side of the interface is the heavily boron doped germanium layer (layer 318/320 of FIG. 3F or cap 317/319 of FIG. 3G) and on the other side of the interface is the substrate 300 material that makes up the channel region. The boron in the source/drain epi-tips 318A/320A remains substantially or completely within the epi-tips and does not tend to diffuse into the channel region, thereby enabling the heavily boron doped germanium material in very close proximity to the channel region relative to conventional techniques. For instance, in some specific embodiments, the source/drain epi-tips 318A/320A may undercut the gate dielectric layer 302 by more than 10 nm. This in turn enables the gate length to be scaled down without having to shorten the channel region.

Forming the source and drain epi-tips in relatively close proximity to the channel region also imparts a larger hydrostatic stress on the channel. This stress increases the strain within the channel, thereby increasing mobility in the channel and increasing drive current. This stress can be further amplified by increasing the germanium concentration of the source and drain epi-tips. This is an improvement over diffusion-based processes where the tip regions generally do not induce a strain on the channel region.

Figure 3H:
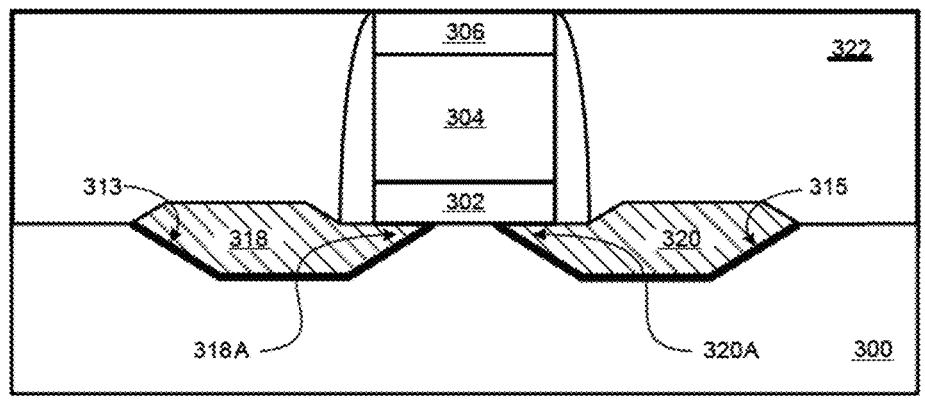

Once the source and drain regions are filled in accordance with an embodiment of the present invention, various conventional MOS processing can be carried out to complete fabrication of MOS transistor 316, such as replacement gate oxide processes, replacement metal gate processes, annealing, and salicidation processes, that may further modify the transistor 316 and/or provide the necessary electrical interconnections. For instance, after the epitaxial deposition of the source/drain regions along with their respective tips, and with further reference to FIG. 2, the method 200 may continue with depositing 216 an interlayer dielectric (ILD) over the transistor 316, and then planarizing the ILD layer as commonly done. The ILD layer may be formed using materials known for the applicability in dielectric layers for integrated circuit structures, such as low-k dielectric materials. Such dielectric materials include, for example, oxides such as silicon dioxide ($SiO_2$) and carbon doped oxide (CDO), silicon nitride, organic polymers such as perfluorocyclobutane or polytetrafluoroethylene, fluorosilicate glass (FSG), and organosilicates such as silsesquioxane, siloxane, or organosilicate glass. In some example configurations, the ILD layer may include pores or other voids to further reduce its dielectric constant. FIG. 3H illustrates an example ILD layer 322 that has been deposited and then planarized down to the hard mask 306.

Figure 3I:
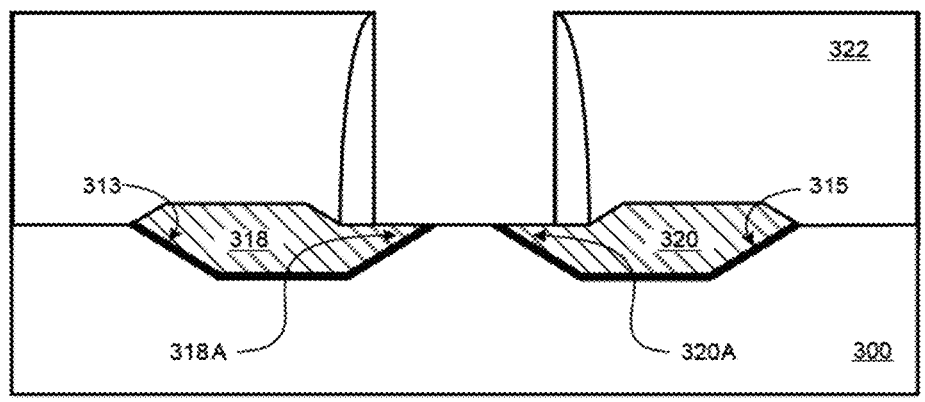

Next, in some embodiments of the present invention where a replacement metal gate process is used, the method 200 continues with removing 218 the gate stack (including the high-k gate dielectric layer 302, the sacrificial gate electrode 304, and the hard mask layer 306) using an etching process as conventionally done. In alternate implementations, only the sacrificial gate 304 is removed. FIG. 3I illustrates the trench opening that is formed when the gate stack is etched away, in accordance with one such embodiment. If the gate dielectric layer is removed, the method may continue with depositing 220 a new gate dielectric layer into the trench opening. Any suitable high-k dielectric materials such as those previously described may be used here, such as hafnium oxide. The same deposition processes may also be used. Replacement of the gate dielectric layer may be used, for example, to address any damage that may have occurred to the original gate dielectric layer during application of the dry and wet etch processes, and/or to replace a low-k or sacrificial dielectric material with a high-k or otherwise desired gate dielectric material.

Figure 3J:
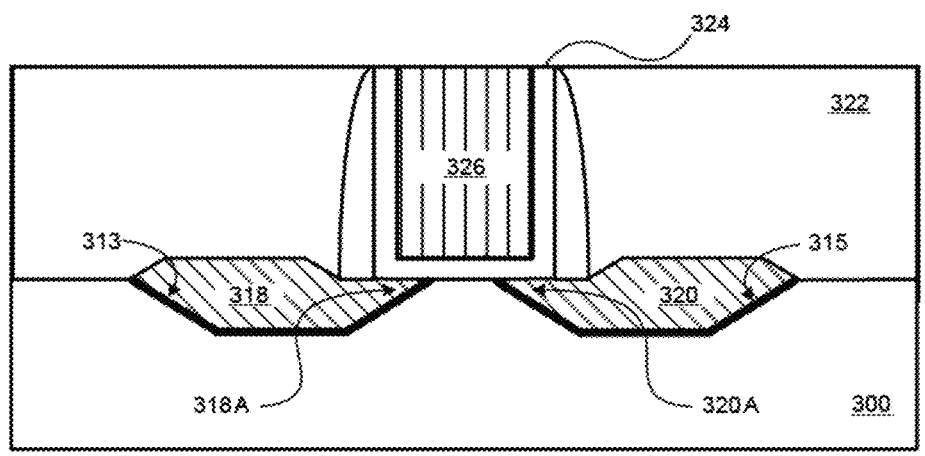

The method 200 may then continue with depositing 222 the metal gate electrode layer into the trench and over the gate dielectric layer. Conventional metal deposition processes may be used to form the metal gate electrode layer, such as CVD, ALD, PVD, electroless plating, or electroplating. The metal gate electrode layer may include, for example, a P-type workfunction metal, such as ruthenium, palladium, platinum, cobalt, nickel, and conductive metal oxides (e.g., ruthenium oxide). In some example configurations, two or more metal gate electrode layers may be deposited. For instance, a workfunction metal may be deposited followed by a suitable metal gate electrode fill metal such as aluminum. FIG. 3J illustrates an example high-k gate dielectric layer 324 and a metal gate electrode 326 that have been deposited into the trench opening, in accordance with one embodiment.

Metalization of the source and drain contacts can be carried out using a silicidation process (generally, deposition of contact metal and subsequent annealing). For instance, silicidation with nickel, aluminum, nickel-platinum or nickel-aluminum or other alloys of nickel and aluminum, or titanium with or without germanium pre-amorphization implants can be used to form a low resistance germanide. The boron doped germanium epi layer allows for metal-germanide formation (e.g., nickel-germanium). The germanide allows for significantly lower Schottky-barrier height and improved contact resistance (including Rext) over that in conventional metal-silicide systems. For instance, conventional transistors typically use a source/drain SiGe epi process, with germanium concentration in the range of 30-40 atomic %. Such conventional systems exhibit Rext values of about 140 Ohm*um, limited by epi/silicide interfacial resistance, which is high and may impede future gate pitch scaling. Some embodiments of the present invention allow for a significant improvement in Rext in PMOS devices (e.g., about a 2× improvement, or a Rext of about 70 Ohm*um), which can better support PMOS device scaling. Thus, transistors having a source/drain configured with heavily boron doped germanium in accordance with an embodiment of the present, with a boron concentration in excess of 1E20 $cm^{-3}$ and a germanium concentration in excess of 50 atomic % and up to or otherwise near pure germanium (100 atomic %) at the interface between the source/drain epi-tips and the channel region, can exhibit Rext values of less than 100 Ohm*um, and in some cases less than 90 Ohm*um, and in some cases less than 80 Ohm*um, and in some cases less than 75 Ohm*um, or lower.

Accordingly, self-aligned source and drain epi-tips have been disclosed that reduce the overall resistance of the MOS transistor and increase channel strain due to increased boron doped germanium volume (e.g., boron doped germanium or boron doped silicon germanium volume with a germanium cap). In some such embodiments, the source and drain epi-tips do not have a bulleted profile, form an abrupt boundary between the channel region and the source and drain regions, and/or have a doping concentration that is more readily controlled, yielding a more optimized source-drain profile. Furthermore, by selecting an appropriate combination of a dopant and an etchant recipe in accordance with some embodiments, the source and drain epi-tips can be etched without being substantially impacted by the spacer thickness. This self-aligned process can therefore be used to increase performance while minimizing process variation, where desirable to do so.

FinFET Configuration

As is known, FinFET is a transistor built around a thin strip of semiconductor material (generally referred to as the fin). The transistor includes the standard field effect transistor (FET) nodes, including a gate, a gate dielectric, a source region, and a drain region. The conductive channel of the device resides on the outer sides of the fin beneath the gate dielectric. Specifically, current runs along both sidewalls of the fin (sides perpendicular to the substrate surface) as well as along the top of the fin (side parallel to the substrate surface). Because the conductive channel of such configurations essentially resides along the three different outer, planar regions of the fin, such a FinFET design is sometimes referred to as a tri-gate FinFET. Other types of FinFET configurations are also available, such as so-called double-gate FinFETs, in which the conductive channel principally resides only along the two sidewalls of the fin (and not along the top of the fin).

Figure 4:
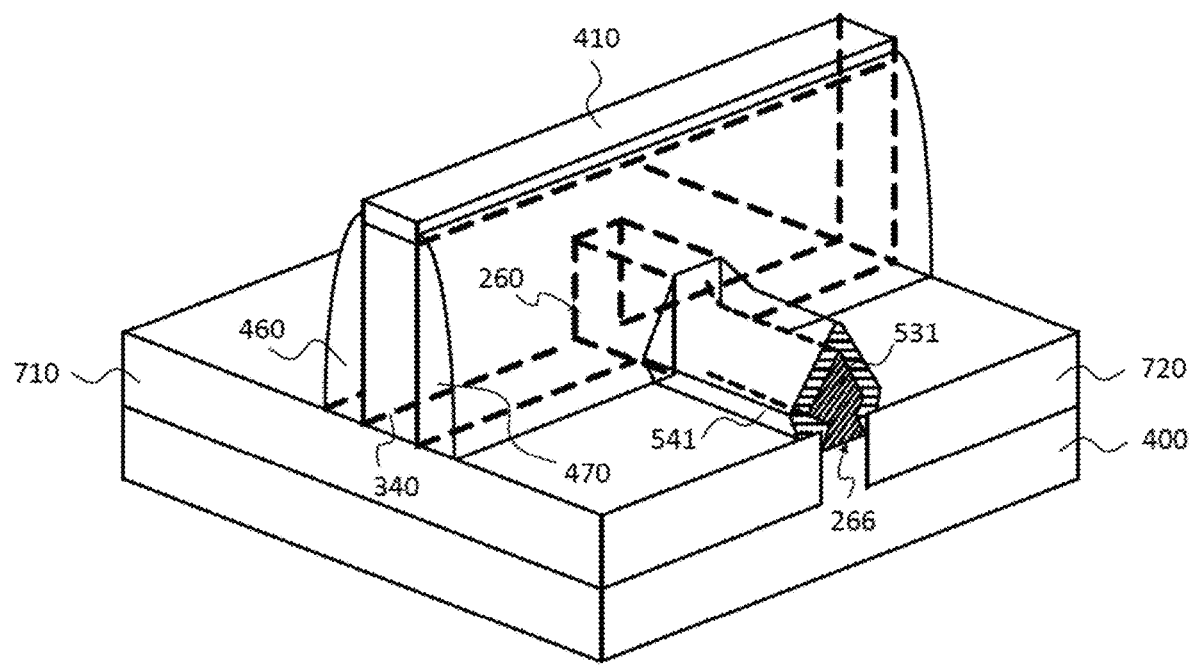
FIG. 4 shows a perspective view of a FinFET transistor architecture, configured in accordance with one embodiment of the present invention.

FIG. 4 shows a perspective view of an example tri-gate architecture, configured in accordance with one embodiment of the present invention. As can be seen, the tri-gate device includes a substrate 400 having a semiconductor body or fin 260 (represented by dashed lines) extending from the substrate 400 through isolation regions 710, 720. A gate electrode 340 is formed over 3 surfaces of the fin 260 to form 3 gates. A hard mask 410 is formed on top of the gate electrode 340. Gate spacers 460, 470 are formed at opposite sidewalls of the gate electrode 340. A source region comprises the epitaxial region 531 formed on a recessed source interface 266 and on one fin 260 sidewall, and a drain region comprises the epitaxial region 531 formed on a recessed source interface 266 and on the opposing fin 260 sidewall (not shown). A cap layer 541 is deposited over the epitaxial regions 531. In one embodiment, the isolation regions 710, 720 are shallow trench isolation (STI) regions formed by common techniques, such as etching the substrate 200 to form trenches, and then depositing oxide material onto the trenches to form the STI regions. The isolation regions 710, 720 can be made from any well known insulative material, such as $SiO_2$. The previous discussion with respect to the substrate 102 is equally applicable here (e.g., substrate 400 may be a silicon substrate, or SOI substrate, or a multi-layered substrate).

As will be appreciated in light of this disclosure, conventional processes and forming techniques can be used to fabricate the tri-gate transistor structure. However, and in accordance with one example embodiment of the present invention, the bilayer structure of the epitaxial region 531 and cap layer 541 can be implemented using an in situ boron doped silicon germanium capped with a heavily boron doped germanium, with an optional germanium and/or boron graded buffer between the two bilayers. As previously explained, such a buffer may be used to transition from a base level germanium/boron concentration compatible with the boron doped SiGe deposited for epitaxial region 531 in the recessed source interface 266 to the heavily boron doped germanium cap 541. Alternatively, germanium and/or boron concentration grading can be implemented directly in the epitaxial region 531, rather than in an intervening graded buffer arrangement. As will further be appreciated, note that an alternative to the tri-gate configuration is a double-gate architecture, which includes a dielectric/isolation layer on top of the fin 260.

Figure 5:
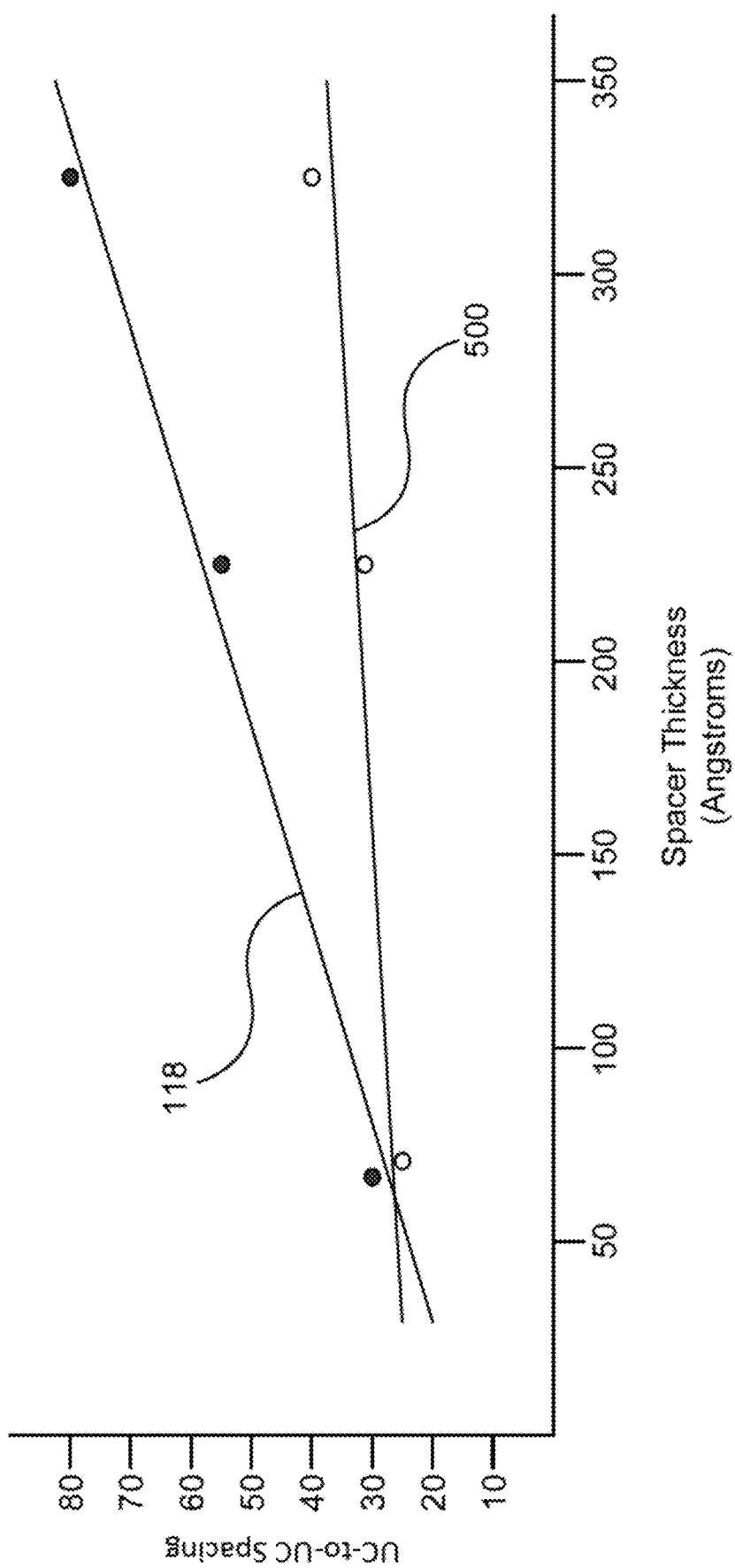
FIG. 5 is a graph illustrating how the UC-to-UC distance of a MOS device formed in accordance with an embodiment of the present invention is less dependent on spacer thickness.
Figure 6A:
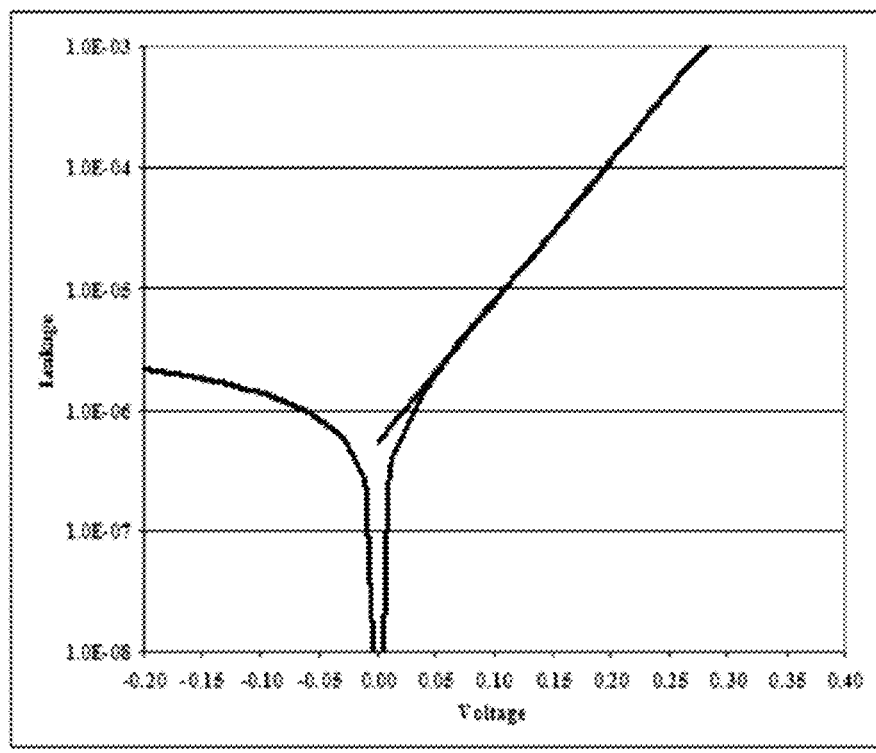
FIG. 6A illustrates Schottky barrier nickel germanide (NiGe) diode measurements, confirming that the NiGe workfunction is about 85 mV of the valance band edge, in accordance with some embodiments of the present invention.
Figure 6B:
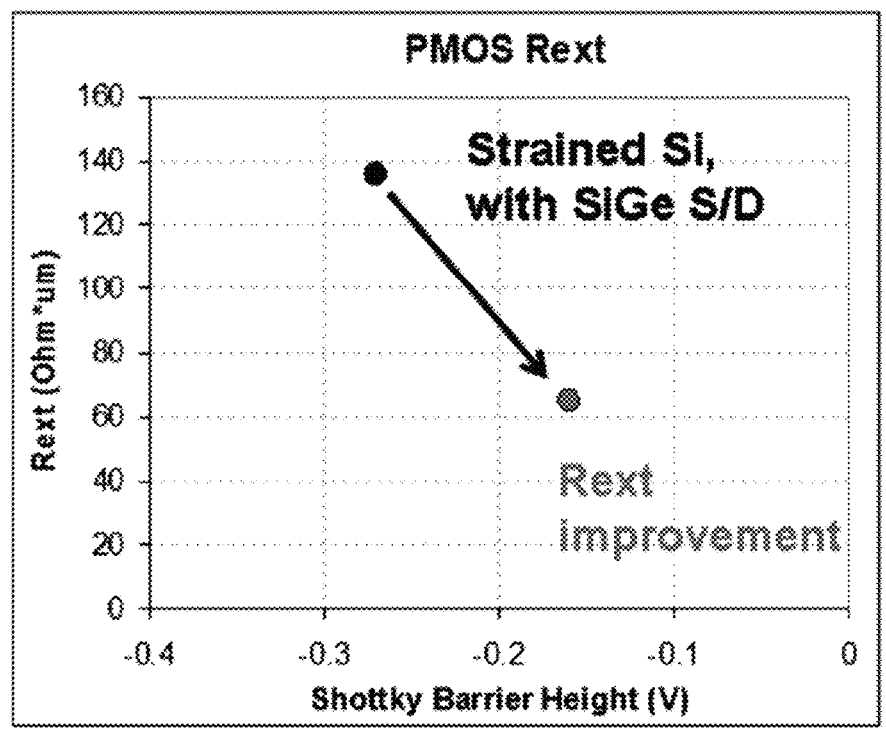
FIG. 6B plots simulation data that shows that such germanide materials provide a significant Rext improvement over that in conventional silicon germanium source/drain PMOS devices, in accordance with some embodiments of the present invention.

FIG. 5 is a graph illustrating an improvement made available by using self-aligned source and drain epi-tips configured in accordance with one example embodiment of the present invention. Line 500 represents data collected for MOS devices built using techniques provided herein. As shown, the UC-to-UC distance is much less impacted by spacer thickness than devices formed using conventional processes, the data for which is again represented by line 118. FIGS. 6A and 6B further demonstrate improvements enabled by using self-aligned source and drain epi-tips configured in accordance with one example embodiment of the present invention. In particular, FIG. 6A illustrates Schottky barrier NiGe diode measurements (leakage v. voltage), confirming that the nickel-germanium workfunction is very p-type (roughly 85 mV above the Ge valance band). FIG. 6B plots simulation data that shows that such germa-nide materials and Schottky barrier height improvement enables more than a 2× Rext improvement over that in conventional SiGe source/drain PMOS devices, in accordance with some example embodiments of the present invention. As is known, the Schottky barrier height is the rectifying barrier for electrical conduction across a semiconductor-metal junction. The magnitude of the Schottky barrier height reflects a mismatch in the energy position of the metal's Fermi level and the majority carrier band edge of the semiconductor across the semiconductor-metal interface. For a p-type semiconductor-metal interface, the Schottky barrier height is the difference between the metal Fermi level and the valence band maximum of the semiconductor.

Thus, and as will be appreciated in light of this disclosure, various embodiments of the present invention provided herein can be used to address several transistor scaling issues, such as providing for higher channel mobility with pitch and power supply (Vcc) scaling, providing reduced source/drain and contact resistance, providing for improved channel abruptness, and providing reduced barrier height between salicide and source/drain to minimize overall parasitic resistance, particularly in planar and non-planar architectures. Numerous embodiments will be apparent in light of this disclosure.

One example embodiment of the present invention provides a transistor device. The device includes a substrate having a channel region. The device further includes a gate electrode above the channel region, wherein a gate dielectric layer is provided between the gate electrode and the channel region and spacers are provided on sides of the gate electrode. The device further includes source and drain regions formed in the substrate and adjacent to the channel region, each of the source and drain regions including a tip region that extends under the gate dielectric layer and/or a corresponding one of the spacers, wherein the source and drain regions comprise a boron doped germanium layer having a germanium concentration in excess of 50 atomic % and a boron concentration in excess of 1E20 $cm^{-3}$. In one such case, the device is one of a planar or FinFET PMOS transistor. In another such case, the device may include metal-germanide source and drain contacts. In another such case, the device may include an interlayer dielectric over the source and drain regions. In another such case, the device may include a buffer between the substrate and the boron doped germanium layer. In one such specific case, the buffer has a germanium concentration that is graded from a base level concentration compatible with the substrate to a high concentration in excess of 95 atomic %. In another such specific case, the buffer has a boron concentration that is graded from a base level concentration compatible with the substrate to a high concentration in excess of 1E20 $cm^{-3}$. In another particular embodiment, the boron doped germanium layer has a bilayer construction comprising a boron doped silicon germanium portion and a boron doped germanium cap thereon. In one such specific case, the boron doped silicon germanium portion has a germanium concentration that is graded from a base level concentration compatible with the substrate to a high concentration in excess of 50 atomic %, and the boron doped germanium cap has a germanium concentration in excess of 95 atomic %. In another such specific case, the boron doped silicon germanium portion has a boron concentration that is graded from a base level concentration compatible with the substrate to a high concentration in excess of 1E20 $cm^{-3}$. In another such specific case, the boron doped silicon germanium portion has a fixed germanium concentration, and the device further comprises a buffer between the boron doped silicon germanium portion and the boron doped germanium cap, the buffer having a germanium concentration that is graded from a base level concentration compatible with the boron doped silicon germanium portion to a high concentration in excess of 50 atomic %, and a boron concentration that is graded from a base level concentration compatible with the boron doped silicon germanium portion to a high concentration in excess of 1E20 cm$^{-3}$. In another particular case, the transistor has a Rext value of less than 100 Ohm*um (such as Rext=70 Ohm*um, +/−10%). As will be appreciated, the boron concentration can be set higher based on factors such as desired conductivity, and in some such example cases is in excess of 2E20 cm$^{-3}$ or 3E20 cm$^{-3}$ or 4E20 cm$^{-3}$ or 5E20 cm$^{-3}$ 2E21 cm$^{-3}$.

Another embodiment of the present invention provides a transistor device. In this example case, the device includes a substrate having a channel region and a gate electrode above the channel region, wherein a gate dielectric layer is provided between the gate electrode and the channel region and spacers are provided on sides of the gate electrode. The device further includes source and drain regions formed in the substrate and adjacent to the channel region, each of the source and drain regions including a tip region that extends under the gate dielectric layer and/or a corresponding one of the spacers, wherein the source and drain regions comprise a boron doped germanium layer having a germanium concentration in excess of 50 atomic % and a boron concentration in excess of 2E20 cm$^{-3}$. The device further includes metal-germanide source and drain contacts. In some such cases, the device may further include a buffer between the substrate and the boron doped germanium layer, wherein the buffer has a germanium concentration that is graded from a base level concentration compatible with the substrate to a high concentration in excess of 95 atomic %, and a boron concentration that is graded from a base level concentration compatible with the substrate to a high concentration in excess of 2E20 cm$^{-3}$. In other example cases, the boron doped germanium layer has a bilayer construction comprising a boron doped silicon germanium portion and a boron doped germanium cap thereon. In some such specific cases, the boron doped silicon germanium portion has a germanium concentration that is graded from a base level concentration compatible with the substrate to a high concentration in excess of 50 atomic %, and the boron doped germanium cap has a germanium concentration in excess of 95 atomic %. In some such specific embodiments, the boron doped silicon germanium portion has a boron concentration that is graded from a base level concentration compatible with the substrate to a high concentration in excess of 2E20 cm$^{-3}$. In other specific cases, the boron doped silicon germanium portion has a fixed germanium concentration, and the device further comprises a thin buffer between the boron doped silicon germanium portion and the boron doped germanium cap, the buffer having a germanium concentration that is graded from a base level concentration compatible with the boron doped silicon germanium portion to a high concentration in excess of 50 atomic %, and a boron concentration that is graded from a base level concentration compatible with the boron doped silicon germanium portion to a high concentration in excess of 2E20 cm$^{-3}$, the buffer having a thickness of less than 100 Angstroms.

Another embodiment of the present invention provides a method for forming a transistor device. The method includes providing a substrate having a channel region, and providing a gate electrode above the channel region, wherein a gate dielectric layer is provided between the gate electrode and the channel region and spacers are provided on sides of the gate electrode. The method continues with forming source and drain regions in the substrate and adjacent to the channel region, each of the source and drain regions including a tip region that extends under the gate dielectric layer and/or a corresponding one of the spacers, wherein the source and drain regions comprise a boron doped germanium layer having a germanium concentration in excess of 50 atomic % and a boron concentration in excess of 1E20 cm$^{-3}$. In some such embodiments, the method further includes providing a buffer between the substrate and the boron doped germanium layer, wherein the buffer has a germanium concentration that is graded from a base level concentration compatible with the substrate to a high concentration in excess of 95 atomic %, and a boron concentration that is graded from a base level concentration compatible with the substrate to a high concentration in excess of 1E20 cm$^{-3}$. In other embodiments, the boron doped germanium layer has a bilayer construction comprising a boron doped silicon germanium portion and a boron doped germanium cap thereon. In one such case, the boron doped silicon germanium portion has a germanium concentration that is graded from a base level concentration compatible with the substrate to a high concentration in excess of 50 atomic %, and the boron doped germanium cap has a germanium concentration in excess of 95 atomic %. In another such case, the boron doped silicon germanium portion has a fixed germanium concentration, and the method further includes providing a buffer between the boron doped silicon germanium portion and the boron doped germanium cap, the buffer having a germanium concentration that is graded from a base level concentration compatible with the boron doped silicon germanium portion to a high concentration in excess of 50 atomic %, and a boron concentration that is graded from a base level concentration compatible with the boron doped silicon germanium portion to a high concentration in excess of 1E20 cm-3. In some such cases, the boron doped silicon germanium portion has a boron concentration that is graded from a base level concentration compatible with the substrate to a high concentration in excess of 1E20 cm$^{-3}$.

The foregoing description of example embodiments of the invention has been presented for the purposes of illustration and description. It is not intended to be exhaustive or to limit the invention to the precise forms disclosed. Many modifications and variations are possible in light of this disclosure. For instance, while some embodiments of the present invention utilize in situ boron doping of germanium, other embodiments may use an intrinsic germanium that after its deposition is subsequently subjected to boron implantation and annealing processes to provide the desired boron doping concentration. Moreover, some embodiments may include source and drain regions fabricated as described herein (e.g., having a germanium concentration in excess of 50 atomic % and a boron concentration in excess of 1E20 cm$^{-3}$), but still use conventional processing (e.g., implantation and annealing) to form the tips of the source and drain regions. In such embodiments, the tips may have a lower germanium and/or boron concentration than the main source/drain region, which may be acceptable in some applications. In still other embodiments, only tips of the source and drain regions may be configured with the high germanium and boron concentrations and the main portions of the source and drain regions may have conventional or otherwise lower germanium/boron concentrations. It is intended that the scope of the invention be limited not by this detailed description, but rather by the claims appended hereto.

What is claimed is:

1. An integrated circuit structure, comprising:
   a fin comprising silicon
      a gate electrode over the fin, the gate electrode having a first side, and the gate electrode having a second side opposite the first side;
      a first dielectric spacer along the first side of the gate electrode;
      a first source or drain region in the fin proximate the first side of the gate electrode, a portion of the first source or drain region beneath the first dielectric spacer, and the first source or drain region comprising two or more facets and a top surface, wherein the first source or drain region comprises silicon and germanium having a germanium concentration graded to a concentration in excess of 50%, and wherein the first source or drain region comprises a boron concentration in excess of 1E20;
      a first layer over the top surface of the first source or drain region, the first layer comprising silicon, germanium and titanium;
      a second dielectric spacer along the second side of the gate electrode;
      a second source or drain region in the fin proximate the second side of the gate electrode, a portion of the second source or drain region beneath the second dielectric spacer, and the second source or drain region comprising two or more facets and a top surface, wherein the second source or drain region comprises silicon and germanium having a germanium concentration graded to a concentration in excess of 50%, and wherein the second source or drain region comprises a boron concentration in excess of 1E20; and
      a second layer over the top surface of the second source or drain region, the second layer comprising silicon, germanium and titanium.

2. The integrated circuit structure of claim 1, further comprising:
   an isolation region, wherein the fin protrudes through the isolation region, and wherein a portion of the gate electrode, a portion of the first dielectric spacer, and a portion of the second dielectric spacer are over the isolation region.

3. The integrated circuit structure of claim 1, further comprising:
   a gate dielectric layer, wherein the gate electrode is on the gate dielectric layer, wherein the gate dielectric layer comprises a high-k dielectric material, and wherein the gate electrode comprises a metal layer.

4. The integrated circuit structure of claim 1, wherein the first source or drain region comprises three or more facets, and the second source or drain region comprises three or more facets.

5. The integrated circuit structure of claim 1, wherein the first source or drain region comprises four or more facets, and the second source or drain region comprises four or more facets.

6. The integrated circuit structure of claim 1, wherein the first source or drain region comprises a boron concentration in excess of 5E20, and wherein the second source or drain region comprises a boron concentration in excess of 5E20.

7. The integrated circuit structure of claim 1, wherein the first source or drain region comprises a boron concentration in excess of 2E21, and wherein the second source or drain region comprises a boron concentration in excess of 2E21.

8. An integrated circuit structure, comprising:
   a body comprising silicon;
   a gate electrode over the body, the gate electrode having a first side, and the gate electrode having a second side opposite the first side;
   a first dielectric spacer along the first side of the gate electrode;
   a first source or drain region in the body proximate the first side of the gate electrode, a portion of the first source or drain region beneath the first dielectric spacer, and the first source or drain region comprising two or more facets and a top surface, wherein the first source or drain region comprises silicon and germanium having a germanium concentration graded to a concentration in excess of 50%, and wherein the first source or drain region comprises a boron concentration in excess of 1E20;
   a first layer over the top surface of the first source or drain region, the first layer comprising silicon, germanium and titanium;
   a second dielectric spacer along the second side of the gate electrode;
   a second source or drain region in the body proximate the second side of the gate electrode, a portion of the second source or drain region beneath the second dielectric spacer, and the second source or drain region comprising two or more facets and a top surface, wherein the second source or drain region comprises silicon and germanium having a germanium concentration graded to a concentration in excess of 50%, and wherein the second source or drain region comprises a boron concentration in excess of 1E20; and
   a second layer over the top surface of the second source or drain region, the second layer comprising silicon, germanium and titanium.

9. The integrated circuit structure of claim 8, further comprising:
   an isolation region, wherein the body protrudes through the isolation region, and wherein a portion of the gate electrode, a portion of the first dielectric spacer, and a portion of the second dielectric spacer are over the isolation region.

10. The integrated circuit structure of claim 8, further comprising:
    a gate dielectric layer, wherein the gate electrode is on the gate dielectric layer, wherein the gate dielectric layer comprises a high-k dielectric material, and wherein the gate electrode comprises a metal layer.

11. The integrated circuit structure of claim 8, wherein the first source or drain region comprises three or more facets, and the second source or drain region comprises three or more facets.

12. The integrated circuit structure of claim 8, wherein the first source or drain region comprises a boron concentration in excess of 5E20, and wherein the second source or drain region comprises a boron concentration in excess of 5E20.

13. The integrated circuit structure of claim 8, wherein the first source or drain region comprises a boron concentration in excess of 2E21, and wherein the second source or drain region comprises a boron concentration in excess of 2E21.

14. An integrated circuit structure, comprising:
    a fin comprising silicon;
    a gate electrode over the fin, the gate electrode having a first side, and the gate electrode having a second side opposite the first side;

a first dielectric spacer along the first side of the gate electrode;

a first layer above the fin and proximate the first dielectric spacer, the first layer comprising silicon, germanium and titanium;

a first semiconductor region between the first layer and the fin, a portion of the first semiconductor region beneath the first dielectric spacer, and the first semiconductor region comprising two or more facets and a top surface, wherein a first region of the first semiconductor region comprises silicon and germanium having a germanium concentration graded to a concentration in excess of 50%, and wherein a second region of the first semiconductor region comprises a boron concentration in excess of 1E20;

a second dielectric spacer along the second side of the gate electrode;

a second layer above the fin and proximate the second dielectric spacer, the second layer comprising silicon, germanium and titanium; and a second semiconductor region between the second layer and the fin, a portion of the second semiconductor region beneath the second dielectric spacer, and the second semiconductor region comprising two or more facets and a top surface, wherein a first region of the second semiconductor region comprises silicon and germanium having a germanium concentration graded to a concentration in excess of 50%, and wherein a second region of the second semiconductor region comprises a boron concentration in excess of 1E20.

15. The integrated circuit structure of claim 14, further comprising:

an isolation region, wherein the fin protrudes through the isolation region, and wherein a portion of the gate electrode, a portion of the first dielectric spacer, and a portion of the second dielectric spacer are over the isolation region.

16. The integrated circuit structure of claim 14, further comprising:

a gate dielectric layer, wherein the gate electrode is on the gate dielectric layer, wherein the gate dielectric layer comprises a high-k dielectric material, and wherein the gate electrode comprises a metal layer.

17. The integrated circuit structure of claim 14, wherein the first semiconductor region comprises three or more facets, and the second semiconductor region comprises three or more facets.

18. The integrated circuit structure of claim 14, wherein the first semiconductor region comprises four or more facets, and the second semiconductor region comprises four or more facets.

19. The integrated circuit structure of claim 14, wherein the first semiconductor region comprises a boron concentration in excess of 5E20, and wherein the second semiconductor region comprises a boron concentration in excess of 5E20.

20. The integrated circuit structure of claim 14, wherein the first semiconductor region comprises a boron concentration in excess of 2E21, and wherein the second semiconductor region comprises a boron concentration in excess of 2E21.

* * * * *